(12) United States Patent
Maeda et al.

(10) Patent No.: US 11,894,498 B2
(45) Date of Patent: Feb. 6, 2024

(54) LIGHT EMITTING DEVICE

(71) Applicant: NICHIA CORPORATION, Anan (JP)

(72) Inventors: Rie Maeda, Katsuura-gun (JP);
Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/863,393

(22) Filed: Jul. 13, 2022

(65) Prior Publication Data

US 2022/0352438 A1    Nov. 3, 2022

Related U.S. Application Data

(62) Division of application No. 17/008,641, filed on Sep. 1, 2020, now Pat. No. 11,424,395.

(30) Foreign Application Priority Data

Sep. 12, 2019  (JP) .................................. 2019-165984

(51) Int. Cl.
*H01L 33/56* (2010.01)
*H01L 33/00* (2010.01)
*H01L 33/62* (2010.01)

(52) U.S. Cl.
CPC .......... *H01L 33/56* (2013.01); *H01L 33/0095* (2013.01); *H01L 33/62* (2013.01)

(58) Field of Classification Search
CPC ..... H01L 33/56; H01L 33/0095; H01L 33/62; H01L 2933/0066; H01L 25/0753;

(Continued)

(56) References Cited

U.S. PATENT DOCUMENTS 10,217,918 B2 *   2/2019  Lee .................... H01L 33/56
2011/0073889 A1 * 3/2011  Sugizaki ............... H01L 33/505
                                              257/E33.061

(Continued)

FOREIGN PATENT DOCUMENTS

JP   2004-047617    2/2004
JP   2004-119631    4/2004

(Continued)

OTHER PUBLICATIONS

Requirement for Restriction and Election of Species issued by the U.S. Patent and Trademark Office for the parent U.S. Appl. No. 17/008,641, dated Jan. 12, 2022.

(Continued)

*Primary Examiner* — Victor A Mandala
(74) *Attorney, Agent, or Firm* — MORI & WARD, LLP

(57) ABSTRACT

A light emitting device including a first light emitting element that includes a first electrode having a first polarity and a second electrode having a second polarity that is different from the first polarity. The device has a circuit element that includes a main body, and first and second terminals electrically connected with one another via the main body. The device includes a first wiring having the first polarity connecting the first electrode of the first light emitting element and the first terminal, and a second wiring having the second polarity located in a layer common with a layer of the first wiring and including a portion elongated between the first terminal and the second terminal in a bottom view. An upper surface of the main body is positioned at a distance below an interface between a lower surface of the first wiring and the first electrode.

20 Claims, 13 Drawing Sheets

(58) Field of Classification Search
CPC ...... F21K 9/90; F21V 19/0015; F21V 23/004; F21V 23/06; F21Y 2115/10
See application file for complete search history.

(56) References Cited

U.S. PATENT DOCUMENTS

| | | | |
|---|---|---|---|
| 2011/0073900 A1* | 3/2011 | Sugizaki | H01L 24/11 |
| | | | 438/22 |
| 2015/0008589 A1 | 1/2015 | Suzuki et al. | |
| 2015/0129906 A1 | 5/2015 | Weigert | |
| 2017/0103950 A1 | 4/2017 | Kawai | |
| 2017/0316998 A1 | 11/2017 | Marutani et al. | |
| 2018/0082990 A1 | 3/2018 | Furuyama | |
| 2018/0277728 A1* | 9/2018 | Takeya | H01L 25/0753 |
| 2019/0051805 A1* | 2/2019 | Oh | H01L 27/153 |
| 2019/0259679 A1 | 8/2019 | Kawai | |
| 2019/0373740 A1 | 12/2019 | Taniguchi | |
| 2019/0393198 A1* | 12/2019 | Takeya | H01L 21/6838 |
| 2020/0193895 A1* | 6/2020 | Shao | H05K 1/0274 |
| 2020/0411491 A1* | 12/2020 | Ahmed | H01L 33/502 |

FOREIGN PATENT DOCUMENTS

| | | |
|---|---|---|
| JP | 2007-026858 | 2/2007 |
| JP | 2012-033792 | 2/2012 |
| JP | 2015-015378 | 1/2015 |
| JP | 2015-207703 | 11/2015 |
| JP | 2016-110705 | 6/2016 |
| JP | 2017-199834 | 11/2017 |
| JP | 2018-049892 | 3/2018 |
| JP | 2018-064060 | 4/2018 |
| JP | 2018-092819 | 6/2018 |
| JP | 2019-087658 | 6/2019 |
| JP | 2019-207978 | 12/2019 |
| JP | 2019-207980 | 12/2019 |
| JP | 2019-207981 | 12/2019 |
| WO | WO 2018/070192 | 4/2018 |
| WO | WO 2019/098029 | 5/2019 |

OTHER PUBLICATIONS

Notice of Allowance with Form PTO-892 Notice of References Cited issued by the United States Patent and Trademark Office for the parent U.S. Appl. No. 17/008,641, dated Apr. 13, 2022.

* cited by examiner

LIGHT EMITTING DEVICE

CROSS-REFERENCE TO RELATED APPLICATION

This application is a divisional application of U.S. patent application Ser. No. 17/008,641, filed on Sep. 1, 2020, and claims priority to Japanese Patent Application No. 2019-165984, filed on Sep. 12, 2019, the disclosures of which are hereby incorporated by reference in their entirety.

BACKGROUND

The present disclosure relates to a method of manufacturing a light emitting device and a light emitting device.

Semiconductor light emitting elements exemplified by light emitting devices (LEDs) are widely used as light sources for lighting fixtures and the like. For example, Japanese Patent Publication No. 2016-110705 describes a linear light source achieved by arranging a plurality of light emitting elements on a wiring board or the like, and electrically connecting the light emitting elements via the wiring disposed on the wiring board.

SUMMARY

Disposing wiring for interconnecting light emitting elements on the wiring board side in a light source structure which includes a plurality of light emitting elements requires provision of a wiring board having a wiring pattern designed for and conforming to each arrangement of light emitting elements.

According to one embodiment of the present disclosure, a method of manufacturing a light emitting device includes: forming grooves by removing a portion of a first resin to form a first groove, removing a portion of a second resin to form a second groove, and removing a portion of a third resin to form a third groove, the first groove formed by removing the portion of the first resin of a first light emitting structure including a first light emitting element including a first electrode that is covered by the first resin, the first groove straddling the first resin and the third resin, the second groove formed by removing the portion of the second resin of a second light emitting structure including a second light emitting element including a second electrode that is covered by the second resin, the second groove straddling the second resin and the third resin, the third groove formed by removing the portion of the third resin of covering a conducting part of a circuit element, the third groove including a portion elongated between the first groove and the second groove in a bottom view, wherein at least a portion of the first electrode and a first portion of the conducting part of the circuit element are exposed in the first groove, at least a portion of the second electrode and second portion of the conducting part of the circuit element are exposed in the second groove, and the third groove is formed in the third resin; forming a first wiring including a plurality of independent parts by supplying a first conducting material in the first grove and the second groove; and forming a second wiring electrically separated from the first wiring by supplying a second conducting material in the third groove.

A light emitting device according to another embodiment of the present disclosure includes: a first light emitting element that includes a first electrode having a first polarity and a second electrode having a second polarity that is different from the first polarity; a circuit element that includes a main body, and a first terminal and a second terminal electrically connected with one another via the main body; a first wiring having the first polarity connecting the first electrode of the first light emitting element and the first terminal of the circuit element; and a second wiring having the second polarity located in a layer common with a layer of the first wiring and including a portion elongated between the first terminal and the second terminal of the circuit element in a bottom view, wherein the main body of the circuit element is positioned at a distance from an interface between the first wiring and the first electrode of the first light emitting element toward the face opposite to the first wiring.

According to at least one of the embodiments of the present disclosure, there is no need to provide a wiring board having wiring designed for and conforming to each arrangement of light emitting elements.

DESCRIPTION

Figure 1:
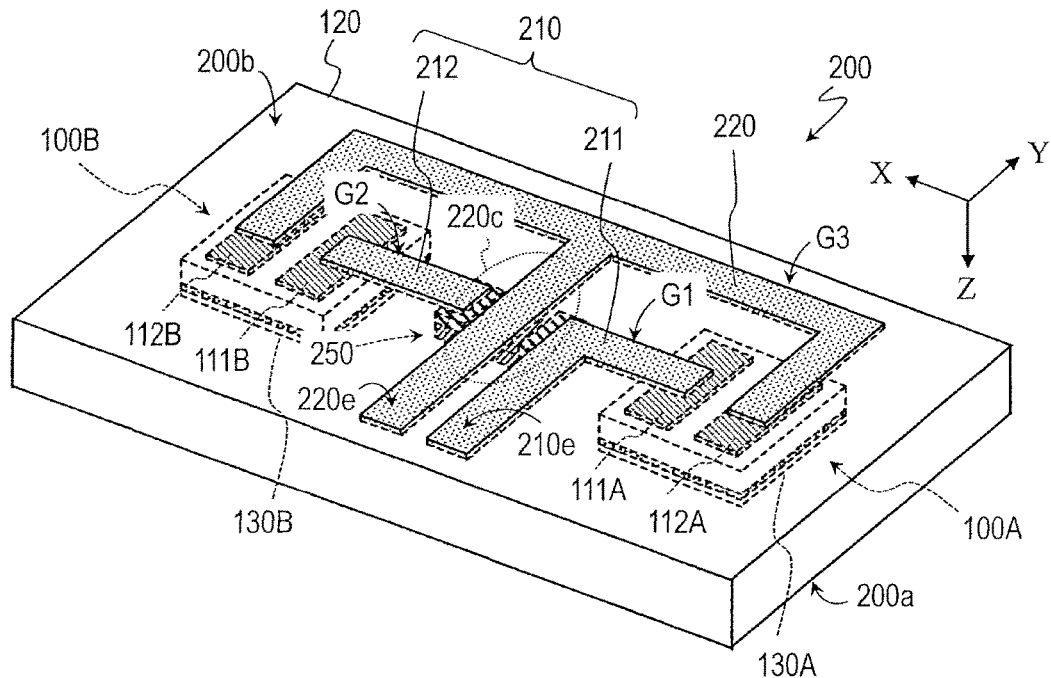
FIG. 1 is a schematic perspective view showing one example of the appearance of a light emitting device according to an embodiment of the present disclosure when viewed from the bottom face side (i.e., bottom view).

Certain embodiments of the present disclosure will be explained in detail below with reference to the accompanying drawings. The embodiments described below are exemplary, and the light emitting devices and the methods of manufacturing the light emitting device according to the present disclosure are not limited to those described below. For example, the numerical values, shapes, materials, steps, and the sequence of the steps described in the embodiments described below are merely examples, and are modifiable in various ways to the extent that such a modification does not cause technical inconsistencies.

The sizes, shapes, and the like of the constituent elements shown in the drawings might be exaggerated for clarity of explanation, and might not reflect the sizes and shapes of, and the relative sizes among the constituent elements in an actual light emitting device or manufacturing equipment. Certain elements might be omitted in a drawing so as not to make the drawing excessively complex.

In the description below, the constituent elements having practically the same functions are denoted by common reference numerals for which explanation might be omitted. In the description below, terms indicating specific directions or positions (e.g., "upper," "lower," "right," "left" and other terms including these) might be used. These terms, however, are merely used in order to make the relative directions or positions in the drawings being referenced more easily understood. As long as the relationship between relative directions or positions indicated with the terms such as "upper," "lower," or the like is the same as those in a referenced drawing, the layout of the elements in other drawings, or actual products and manufacturing equipment outside of the present disclosure, does not have to be the same as those shown in the referenced drawing. In the present disclosure, being "parallel" includes cases where two straight lines, sides, planes, or the like, form an angle in the range of from 0° to about ±5°. In the present disclosure, being "perpendicular" or "orthogonal" includes cases where two straight lines, sides, planes, or the like form an angle in the range of from 90° to about ±5° unless otherwise specifically stated.

Embodiments of Light Emitting Device

FIG. 1 shows an exemplary light emitting device according to an embodiment of the present disclosure. The light emitting device 200 shown in FIG. 1 includes a first light emitting structure 100A which includes a first light emitting element, a second light emitting structure 100B which includes a second light emitting element, and a cover part 120 that covers the light emitting structures. In FIG. 1, the light emitting device 200 is illustrated in the state where the lower face 200b faces up. For convenience sake, arrows indicating X, Y, and Z directions which are orthogonal to one another are also shown in FIG. 1. In the structure shown in FIG. 1, the first light emitting structure 100A and the second light emitting structure 100B are arranged along the X direction in FIG. 1, and the light emitting device 200 as a whole is a rectangular parallelepiped longer in the X direction than in the Y direction. The long sides of the rectangular shape of the lower face 200b of the light emitting device 200 are parallel to the X direction and the short sides are parallel to the Y direction in the drawing. Hereinafter, arrows indicating X, Y, and Z directions are also shown in some of the other drawings of the present disclosure.

As will be discussed later, the cover part 120 is formed from a light reflecting material. The light emitted from the first light emitting element in the first light emitting structure 100A and the light emitted from the second light emitting element in the second light emitting structure 100B are extracted from the upper face 200a located on the opposite side to the lower face 200b. As will be explained in detail later, the first light emitting structure 100A and the second light emitting structure 100B respectively have a first protective member 130A and a second protective member 130B which have light transmissivity on the upper face 100a side that is opposite to the lower face 200b of the light emitting device 200. The light emitted from the first light emitting element 110A in the first light emitting structure 100A and the light emitted from the second light emitting element 110B in the second light emitting structure 100B are extracted from the light emitting device 200 respectively via the first protective member 130A and the second protective member 130B. The term "light transmissivity" in the present disclosure is interpreted as including light diffusion properties relative to the incoming light, i.e., it is not limited to something being "transparent." For example, "light transmissivity" refers to a transmittance of at least 60%, preferably at least 70%, relative to the incoming light.

In this example, the first light emitting structure 100A has a first electrode 111A and a second electrode 112A located on the lower face 200b side of the light emitting device 200. Similarly, the second light emitting structure 100B has a first electrode 111B and a second electrode 112B located on the lower face 200b side of the light emitting device 200. The first light emitting structure 100A and the second light emitting structure 100B will be described in detail later.

As shown in FIG. 1, the light emitting device 200 has first wiring 210 and second wiring 220 on the lower face 200b side. In the structure illustrated in FIG. 1, the first wiring 210 includes a first part 211 connected to the first electrode 111A of the first light emitting structure 110A and a second part 212 connected to the first electrode 111B of the second light emitting structure 100B.

The first part 211 of the first wiring 210 is positioned in the first groove G1 in the lower face of the cover part 120 (i.e., the face opposite to the upper face 200a of the light emitting device 200) formed at a portion closer to a first terminal of the circuit element (later described). The surface of the first wiring externally exposed is substantially flush with the lower face of the cover part 120. Similarly, the lower face of the cover part 120 is provided with a second groove G2, and the second part 212 of the first wiring 210 is located in the second groove G2 formed at a portion closer to a second terminal of the circuit element (later described). The surface of the second part 212 is also substantially flush with the lower face of the cover part 120.

In a bottom view, the first groove G1 has a portion that overlaps the first electrode 111A of the first light emitting structure 100A. In other words, a portion of the first electrode 111A is exposed in the first groove G1. Using the exposed portion in the first groove G1, the first electrode 111A is electrically connected to the first part 211 of the first wiring 210. In a bottom view, the second groove G2 has a portion that overlaps the first electrode 111B of the second light emitting structure 100B. Using the exposed portion in the second groove G2, the first electrode 111B is electrically connected to the second part 212 of the first wiring 210.

The first electrode 111A connected to the first part 211 of the first wiring 210 is, for example, the positive electrode of the first light emitting element in the first light emitting structure 100A. Similarly, the first electrode 111B connected to the second part 212 of the first wiring 210 is, for example, the positive electrode of the second light emitting element in the second light emitting structure 100B. The first part 211 and the second part 212 of the first wiring 210 are two spatially separated and electrically independent parts of the first wiring 210. In the present embodiment, however, the first part 211 and the second part 212 are electrically connected with one another via a jumper element 250 disposed in the cover part 120. The first wiring 210 can be considered as wiring of a first polarity that supplies an electrical current to the first light emitting element 110A in the first light emitting structure 100A and the second light emitting element 110B in the second light emitting structure 100B. In the present disclosure, the "polarity" in relation to wiring is determined by the polarity of the electrode of a light emitting element that is connected to the wiring, not by the conductivity of the wiring itself.

As will be described in detail later with reference to sectional views, a jumper element 250 includes a first terminal, a second terminal, and a main body which electrically connects the first terminal and the second terminal. In the present embodiment, the first groove G1 described above includes a portion that overlaps the first terminal of the jumper element 250 in a bottom view, and the second groove G2 includes a portion that overlaps the second terminal of the jumper element 250 in a bottom view. A portion of the first terminal and a portion of the second terminal of the jumper element 250 are respectively exposed in the first groove G1 and the second groove G2.

In other words, the first terminal of the jumper element 250 is connected, for example, to the first part 211 of the first wiring 210, and the second terminal of the jumper element 250 is connected to the second part 212 of the first wiring 210. Accordingly, the first part 211 of the first wiring 210 electrically connects, for example, the positive electrode of the first light emitting element and the first terminal of the jumper element 250, and the second part 212 of the first wiring 210 electrically connects the positive electrode of the second light emitting element and the second terminal of the jumper element 250. In the present disclosure, the term "jumper element" is broadly interpreted as including an element that has a first terminal, a second terminal and a main body, without being limited to a so-called "jumper chip" that is commercially available.

In this example, the second wiring 220 electrically connects the second electrode 112A which is, for example, the negative electrode of the first light emitting element and the second electrode 112B which is, for example, the negative electrode of the second light emitting element. In other words, the second wiring 220, in the present embodiment, is wiring of a second polarity that is different from the first polarity of the first wiring 210.

The second wiring 220 is located in the same layer as that of the first wiring 210. In other words, the second wiring 220 is positioned inside of the third groove G3 formed in the lower face of the cover part 120. Similar to the first wiring 210, the externally exposed surface of the second wiring 220 is substantially flush with the lower face 200b of the light emitting device 200.

As shown in FIG. 1, in this example, the third groove G3 includes a portion elongated between the first groove G1 and the second groove G2 in addition to a portion overlapping the second electrode 112A of the first light emitting element and a portion overlapping the second electrode 112B of the second light emitting element in a bottom view. Accordingly, the second wiring 220, as indicated by a dotted ellipse in FIG. 1, has as a part thereof an intersecting part 220c elongated between the first terminal and the second terminal of the jumper element 250 in a bottom view. As will be described later, the main body of the jumper element 250 that electrically connects the first terminal and the second terminal is located more distant from the lower face 200b of the light emitting device 200 than the first wiring 210. Accordingly, insulation such as the cover part 120 or the like is interposed between the intersecting part 220c of the second wiring 220 and the main body of the jumper element 250, thereby not allowing them to be in contact with each other. In this manner, the second wiring 220 is electrically separated from the jumper element 250 and the first wiring 210.

In the structure illustrated in FIG. 1, the first wiring 210 and the second wiring 220 respectively have a terminal part 210e and a terminal part 220e that extend to the vicinity of an outer edge of the light emitting device 200. The terminal parts 210e and 220e can be connected to an external power supply such as a driver circuit via a bonding material such as solder. Connecting a power supply to the terminal parts 210e and 220e of the light emitting device 200 allows the first light emitting element in the first light emitting structure 100A and the second light emitting element in the second light emitting structure 100B to be collectively driven. The terminal parts 210e and 220e can respectively be connected via a bonding material such as solder to the positive side and the negative side of the wiring disposed on a wiring board. In this case, connecting a power supply to the wiring board can collectively drive the first light emitting element in the first light emitting structure 100A and the second light emitting element in the second light emitting structure 100B.

Figure 2:
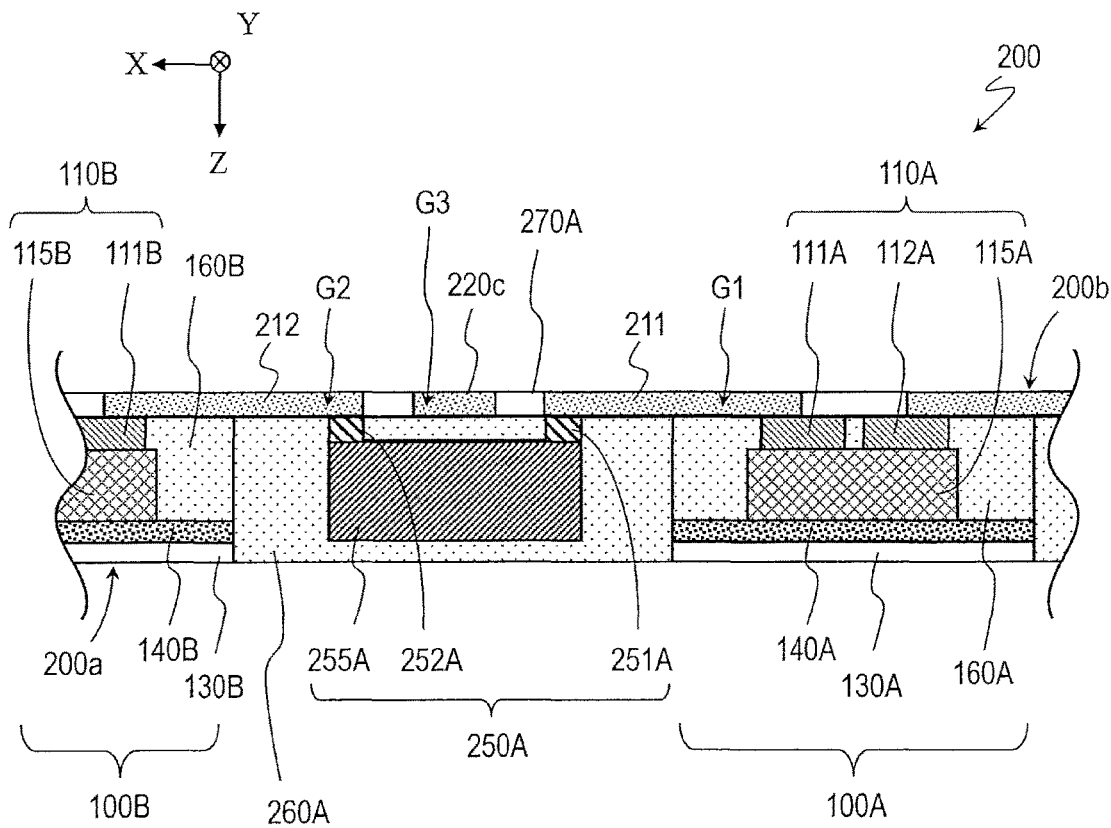
FIG. 2 is a schematic cross section of the light emitting device 200 shown in FIG. 1 when cut perpendicular to the ZX plane near the center of the light emitting device 200.

FIG. 2 schematically shows an example of a cross section of the light emitting device 200 when cut perpendicularly to the lower face 200b at a position that crosses the jumper element 250. The cross section shown in FIG. 2 corresponds to one obtained when the light emitting device 200 is cut perpendicularly to the ZX plane near the center of the light emitting device 200.

As has been explained with reference to FIG. 1, the light emitting device 200 in the present embodiment has a first light emitting structure 100A, a second light emitting structure 100B, and a jumper element 250 disposed in the cover part 120. The jumper member 250A whose cross section is shown in FIG. 2 is an example of the jumper element 250 described above.

The first light emitting structure 100A includes a first light emitting element 110A, as a part thereof, which includes a first electrode 111A and a second electrode 112A. The first light emitting element 110A is a semiconductor light emitting element such as an LED, and includes the first electrode 111A, the second electrode 112A, and a semiconductor stack structure 115A on which the electrodes are disposed.

On the upper face side of the first light emitting element 110A, i.e., the upper face 200a side of the light emitting device 200, for example, a first protective member 130A and a wavelength conversion member 140A are disposed. As schematically shown in FIG. 2, the upper face of the first protective member 130A positioned above the first light emitting element 110A is substantially flush with the upper face 200a of the light emitting device 200. The wavelength conversion member 140A is positioned between the first light emitting element 110A and the first protective member 130A. In the example shown in FIG. 2, the first light emitting element 110A is covered by a reflecting resin member 160A.

In this embodiment, the second light emitting structure 100B has a same or similar structure to the first light emitting structure 100A. In other words, the second light emitting structure 100B has a second light emitting element 110B, a second protective member 130B, a wavelength conversion member 140B, and a reflecting resin member 160B covering the second light emitting element 110B. The upper face of the second protective member 130B positioned above the second light emitting element 110B is substantially flush with the upper face 200a of the light emitting device 200. Similar to the first light emitting element 110A, the second light emitting element 110B has a first electrode 111B, a second electrode 112B, and a semiconductor stack structure 115B.

The first light emitting structure 100A and the second light emitting structure 100B can each have a structure to be singly usable as, for example, a white light emitting light source. The first light emitting structure 100A and the second light emitting structure 100B can be light sources having common components or different components in part.

The jumper member 250A includes a first terminal 251A, a second terminal 252A, and a main body 255A to which the terminals are connected. The first terminal 251A is connected to the first electrode 111A of the first light emitting element 110A via the first part 211 of the first wiring 210, while the second terminal 252A is connected to the first electrode 111B of the second light emitting element 110B via the second part 212 of the first wiring 210. The main body 255A of the jumper member 250A at least includes a conducting part that electrically connects the first terminal 251A and the second terminal 252A. In other words, the first electrode 111A of the first light emitting element 110A and the first electrode 111B of the second light emitting element 110B are electrically connected with one other via the first wiring 210 and the jumper member 250A.

As shown in FIG. 2, in the sectional view, the intersecting part 220c of the second wiring 220 is located between the first part 211 and the second part 212 of the first wiring 210. The main body 255A of the jumper member 250A is positioned at a distance from the interface between the first wiring 210 and the electrodes of light emitting elements (e.g., the interface between the first part 211 and the first electrode 111A of the first light emitting element 110A) toward the face opposite to the first wiring 210. In other words, the main body 255A of the jumper member 250A is located at a lower position than the interface between the first wiring 210 and the electrodes of the light emitting elements, and not directly in contact with the second wiring 220.

As is understood from FIG. 1 and FIG. 2, the portion of the first wiring 210 located between the first electrode 111A of the first light emitting element 110A and the first terminal 251A of the jumper member 250A (in this example, a portion of the first part 211) is elongated in the first direction (in this example, the X direction). Similarly, the portion of the first wiring 210 located between the first electrode 111B of the second light emitting element 110B and the second terminal 252A of the jumper member 250A (in this example, a portion of the second part 212) is elongated in the X direction. In contrast, the portion of the second wiring 220 located between the first terminal 251A and the second terminal 252A of the jumper member 250A (in this example, the intersecting part 220c) is elongated in a second direction (in this example, the Y direction in the drawing) different from the first direction.

In the structure illustrated in FIG. 2, the jumper member 250A is covered by a reflecting resin member 260A. In this example, moreover, a resin layer 270A is disposed on the lower face 200b side of the light emitting device 200. The reflecting resin member 160A of the first light emitting structure 100A, the reflecting resin member 160B of the second light emitting structure 100B, the reflecting resin member 260A surrounding the jumper member 250A, and the resin layer 270A positioned on the lower face 200b side of the light emitting device 200 is collectively configured as the cover part 120 as a whole that covers the first light emitting element 110A, the second light emitting element 110B, and the jumper member 250A.

As will be described later, the first wiring 210 and the second wiring 220 are formed in the grooves formed in the cover part 120 that covers the first light emitting element 110A and the others. The grooves can be formed, for example, by patterning the resin layer located on the lower face 200b side of the light emitting device 200. The grooves can alternatively be formed by partially removing the resin member integrally covering the first light emitting element 110A, the second light emitting element 110B, and the jumper element.

As explained above, according to a certain embodiment of the present disclosure, an intersection between positive side wiring and negative side wiring can be formed on the light emitting device side without making the processes complex. Accordingly, an intersection can be relatively easily provided between wires of different polarities without requiring a multilayer substrate. In such a configuration, wiring interconnecting light emitting elements is formed on the light emitting device side. This can basically eliminate the need for changing the design of the wiring board which supports a light emitting device each time the number or the layout of the light emitting structures changes. This can basically eliminate the need for a wiring board that has the wiring specifically designed for the number or the layout of the light emitting structures, thereby reducing the manufacturing costs.

As can be easily understood from the explanation above, the numbers and the layouts of light emitting structures and jumper elements can basically be appropriately determined, and are not limited to those shown in the example described above. This can provide a high degree of design flexibility for the layout of light emitting elements, connection between light emitting elements, and the like specific to an application. For example, a light emitting device including a plurality of light emitting elements operated by a passive matrix driving method can be provided relatively inexpensively.

For example, forming grooves by laser beam scanning, and forming the first wiring 210 and the second wiring 220 by disposing a conducting material in the grooves can provide a high degree of wiring design flexibility. Wiring thickness can also be relatively easily increased by changing the groove shape, therefore wiring having a large aspect ratio can be formed. This allows light emitting elements to be highly densely arranged in a light emitting device while restraining the wiring resistance from increasing. A high density arrangement of light emitting elements can facilitate size reduction in a light emitting device.

Each constituent element of the light emitting device 200 will be explained in more detail below.

Light Emitting Element

Typical examples of the first light emitting element 110A and the second light emitting element 110B are LEDs. The first light emitting element 110A includes a semiconductor stack structure 115A, and the second light emitting element 110B includes a semiconductor stack structure 115B. The semiconductor stack structure 115A and the semiconductor stack structure 115B generally each include an active layer, and n-type and p-type semiconductor layers which interpose the active layer. A semiconductor stack structure can include a nitride semiconductor ($In_xAl_yGa_{1-x-y}N$, $0 \leq x$, $0 \leq y$, $x+y \leq 1$) capable of emitting light in the UV to visible range. The structure of the first light emitting element 110A and the structure of the second light emitting element 110B can be common, or different from one another. The first light emitting element 110A and the second light emitting element 110B have a common structure in the present embodiment, and blue light emitting LEDs are illustrated as the first light emitting element 110A and the second light emitting element 110B.

The semiconductor stack structure 115A can further include a support substrate formed using sapphire, gallium nitride, or the like that supports a plurality of semiconductor layers, including an n-type semiconductor layer and a p-type semiconductor layer. In this case, the primary face opposite to the primary face on which the semiconductor layers are formed constitutes the upper face of the semiconductor stack structure 115A, and the upper face of the semiconductor stack structure 115A constitutes a part of the upper face of the first light emitting element 110A.

The first electrode 111A and the second electrode 112A of the first light emitting element 110A are disposed on the face opposite to the upper face of the semiconductor stack structure 115A. The first electrode 111A and the second electrode 112A have the function of supplying a predetermined electric current to the semiconductor stack structure 115A. The first electrode 111A and the second electrode 112A, for example, are Cu electrodes. Similarly, the first electrode 111B and the second electrode 112B of the second light emitting element 110B can be Cu electrodes located on the face opposite to the upper face of the semiconductor stack structure 115B.

The lower faces of the first electrode 111A and the second electrode 112A of the first light emitting element 110A are substantially flush with the lower face of the reflecting resin member 160A that covers the semiconductor stack structure 115A. Accordingly, in the structure illustrated in FIG. 2, at least one portion of the first electrode 111A and at least one portion of the second electrode 112A are respectively exposed in the first groove G1 and the third groove G3 on the lower face 200b side of the light emitting device 200. Similarly, in the present embodiment, the lower faces of the first electrode 111B and the second electrode 112B of the second light emitting element 110B are substantially flush with the lower face of the reflecting resin member 160B that covers the semiconductor stack structure 115B. As a result, at least one portion of the first electrode 111B and at least one portion of the second electrode 112B are respectively exposed in the second groove G2 and the third groove G3.

Protective Member

The first protective member 130A and the second protective member 130B are sheet shaped members respectively positioned above the upper faces of the first light emitting element 110A and the second light emitting element 110B, in the light emitting device 200. The first protective member 130A and the second protective member 130B each have a lower face positioned on the light emitting element (the first light emitting element 110A or the second light emitting element 110B) side, an upper face positioned on the upper face 200a side of the light emitting device 200, and lateral faces positioned between the upper faces. The lateral face(s) of the first protective member 130A and the lateral face(s) of the second protective member 130B are covered by the cover part 120. The upper face of the first protective member 130A and the upper face of the second protective member 130B constitute light emission regions of the upper face 200a of the light emitting device 200 from which the light from the light emitting elements is extracted.

Examples of materials employed to form the first protective member 130A and the second protective member 130B include silicone resins, silicone modified resins, epoxy resins, phenol resins, polycarbonate resins, acrylic resins, trimethylpentane resins, polynorbornene resins, and resin compositions containing two or more of these resins. The material for forming the first protective member 130A and the material for forming the second protective member 130B can be common or different. Light scattering properties can be imparted to a protective member, for example, by using a material having a different refractive index from that of the base material to be dispersed in the base material. The first protective member 130A and/or the second protective member 130B can be of a layer formed with glass.

The first protective member 130A and the second protective member 130B are respectively bonded to the upper faces of the first and second light emitting elements 110A and 110B by using, for example, a light transmissive adhesive. Although not illustrated in FIG. 2 for simplification purposes, the hardened adhesive can have portions that cover the lateral faces of the main body of a light emitting element (i.e., the semiconductor stack structure 115A or the semiconductor stack structure 115B).

Wavelength Conversion Member

The wavelength conversion member 140A and the wavelength conversion member 140B are members formed by dispersing phosphor particles in the base material such as a resin. As shown in FIG. 2, the wavelength conversion member 140A is positioned between the first light emitting element 110A and the first protective member 130A, and the wavelength conversion member 140B is positioned between the second light emitting element 110B and the second protective member 130B. In the structure illustrated in FIG. 2, the wavelength conversion member 140A has lateral faces that are flush with the lateral faces of the first protective member 130A. Likewise, the wavelength conversion member 140B has lateral faces that are flush with the lateral faces of the second protective member 130B. These lateral faces are also covered by the cover part 120.

The wavelength conversion member 140A and the wavelength conversion member 140B absorb at least a portion of the light emitted from the light emitting elements, and emit light having a wavelength different from the wavelength of the light from the light emitting elements. For example, the wavelength conversion member 140A and the wavelength conversion member 140B each emit yellow light by respectively converting the wavelength of a portion of the blue light emitted by the first light emitting element 110A and a portion of the blue light emitted by the second light emitting element 110B. With such a structure, the blue light passing through the wavelength conversion members and the yellow light emitted by the wavelength conversion members are mixed, thereby producing white light.

For the base material for the wavelength conversion member 140A and the wavelength conversion member 140B, a silicone resin, modified silicone resin, epoxy resin, modified epoxy resin, urea resin, phenol resin, acrylic resin, urethane resin, fluorine resin, or resin containing two or more of these resins can be used. For phosphors to be dispersed in the base material, any known material can be applied. Examples of phosphors include YAG-based phosphors, fluoride-based phosphors, nitride phosphors, and the like. A YAG-based phosphor is an example of a wavelength conversion material that converts blue light into yellow light. A KSF-based phosphor, which is a fluoride-based phosphor, and a CASN phosphor and a SCASN phosphor, which are nitride phosphors, are examples of wavelength conversion materials that convert blue light into red light. A β-SiAlON phosphor which is another nitride phosphor is an example of a wavelength conversion material that converts blue light into green light. Phosphors can be quantum dot phosphors.

The phosphor dispersed in the base material for the wavelength conversion member 140A and the phosphor dispersed in the base material for the wavelength conversion member 140B can be different from one another. In other words, the wavelength of the light emitted from the first light emitting structure 100A being the same as the wavelength of the light emitted from the second light emitting element 100B in the light emitting device 200 is not essential in the embodiment of the present disclosure.

Jumper Element

The jumper element 250 is a circuit element having the function of electrically connecting wires of a common polarity in the light emitting device 200. For example, the jumper member 250A shown in FIG. 2 electrically connects the first part 211 of the first wiring 210 connected to the first electrode 111A of the first light emitting element 110A to the second part 212 of the first wiring 210 connected to the first electrode 111B of the second light emitting element 110B.

The jumper element 250 is not limited to the jumper member 250A described above, and any member is applicable as long as the member includes a conducting part that can form an intersection between the wiring of a first polarity and the wiring of a second polarity different from the first polarity while ensuring electrical insulation between the two wirings. The jumper member 250A as an example of the jumper element 250 includes a main body 255A, a first terminal 251A, and a second terminal 252A, and these as a whole constitutes a conducting part that forms an intersection between the wiring of a first polarity and the wiring of a second polarity.

For example, instead of the jumper member 250A, a commercially available jumper chip (also known as a zero ohm resistor), for example, can be utilized as a jumper element 250. In general, a jumper chip has a structure in which a conductive layer is disposed on one or both faces of an insulating base, such as a ceramic or glass epoxy, and the surfaces of the conductive layers, excluding the ends of the base, are covered with an insulating layer. Terminal parts formed by plating or the like are provided in the portions of the conductive layers that are not covered by the insulating layer. A few specific examples of a jumper element 250 will be described later.

Reflecting Resin Member

The reflecting resin member 160A is a member that covers the first light emitting element 110A so as to surround the lateral faces of the semiconductor stack structure 115A of the first light emitting element 110A in the first light emitting structure 100A. The reflecting resin member 160A has a reflectance of at least 60% relative to the peak emission wavelength of the light from the first light emitting element 110A. Similarly, the reflecting resin member 160B covers the second light emitting element 110B in the second light emitting structure 100B, and has a reflectance of at least 60% relative to the peak emission wavelength of the light from the second light emitting element 110B. The reflecting resin member 160A and the reflecting resin member 160B can preferably have a reflectance of at least 70%, more preferably at least 80% for the peak emission wavelength of the light from the light emitting element (i.e., the first light emitting element 110A or the second light emitting element 110B).

For the material used to form the reflecting resin member 160A and the reflecting resin member 160B, for example, a resin composition containing a light reflecting filler dispersed therein can be used. For the base material for the reflecting resin member 160A and the reflecting resin member 160B, silicone resins, phenol resins, epoxy resins, BT resin, polyphthalamide (PPA), or the like can be used. For the light reflecting filler, particles of a metal, or particles of an inorganic or organic material having a higher refractive index than an index of the base material can be used. Examples of light reflecting fillers include particles of titanium dioxide, silicon oxide, zirconium dioxide, potassium titanate, aluminum oxide, aluminum nitride, boron nitride, mullite, niobium oxide, barium sulfate, or particles of various rare earth oxides such as yttrium oxide, gadolinium oxide, and the like. From the perspective of achieving a high reflectance, it is advantageous for the reflecting resin member 160A and the reflecting resin member 160B to be white. For the material for forming the reflecting resin member 160A and the reflecting resin member 160B, a glass fiber reinforced resin, or ceramics such as aluminum nitride, aluminum oxide, or zirconium oxide can alternatively be used.

In the structure illustrated in FIG. 2, the reflecting resin member 160A covers the region of the lower face of the semiconductor stack structure 115A of the first light emitting element 110A excluding the regions where the first electrode 111A and the second electrode 112A are present. The reflecting resin member 160B covers the region of the lower face of the semiconductor stack structure 115B of the second light emitting element 110B excluding the regions where the first electrode 111B and the second electrode 112B (not shown in FIG. 2) are present. The reflecting resin members (i.e., the reflecting resin member 160A and the reflecting resin member 160B) covering the regions of the lower faces of the semiconductor stack structures of the light emitting elements excluding the regions where the first electrodes and the second electrodes are present allows the light from the light emitting elements advancing towards the lower face 200b of the light emitting device 200 to be reflected and directed towards the upper face 200a of the light emitting device 200. Accordingly, the leakage of light from the lower face 200b of the light emitting device 200 can be inhibited to thereby improve the light extraction efficiency.

Cover Part

The cover part 120 has a structure as a whole that covers the first light emitting structure 100A and the second light emitting structure 100B as well as the jumper element 250. A first groove G1, a second groove G2, and a third groove 3 are formed on the lower face side of the cover part 120, i.e., on the lower face 200b side of the light emitting device 200.

Typically, the cover part 120 is formed with the same or a similar material to the material employed for the reflecting resin member 160A which covers the first light emitting element 110A and the reflecting resin member 160B which covers the second light emitting element 110B. In other words, the cover part 120 is typically formed with a resin composition containing a light reflecting filler dispersed therein, and is light reflective. It is not necessary for the material used for forming the cover part 120 to be strictly identical with the material employed for the reflecting resin member 160A or 160B. The base material, the type or content of a light reflecting filler can be different between the materials used for the cover part 120 and the reflecting resin member 160A or 160B.

The cover part 120 and the reflecting resin members 160A and 160B have a common feature which is being light reflective. As such, the cover part 120 can be considered as a structure which has the reflecting resin members 160A and 160B as parts thereof. In this regard, the cover part 120 includes a portion that covers the first light emitting element 110A and a portion that covers the second light emitting element 110B. The cover part 120 also has another portion, i.e., the portion that covers the jumper element 250. Assuming that the portion of the cover part covering the first light emitting element 110A, the portion covering the second light emitting element 110B, and the portion covering the jumper element 250 are respectively referred to as a first resin, a second resin, and a third resin, the first groove G1 described above is formed straddling the first and third resins, and the second groove G2 is formed straddling the second and third resins. The portion of the third groove G3 where the aforementioned intersecting part 220c is located is formed in the third resin of the cover part 120.

As will be explained in detail later with reference to drawings, the first groove G1, the second groove G2, and the third groove G3 can be formed by laser beam scanning. In the case of applying laser beam scanning in forming the grooves, dispersing a material that can absorb the laser beam in the cover part 120 allows the cover part 120 to efficiently absorb the laser beam, to thereby efficiently remove parts of the surface of the cover part 120.

A typical example of a material that absorbs a laser beam is a colorant. For example, in the case of applying a UV laser, which has the center wavelength in the UV range, in forming the first groove G1, the second groove G2, and the third groove G3, a filler, such as titanium dioxide, carbon, barium sulfate, zinc oxide, or the like can be dispersed as a laser beam absorbing material in the cover part 120. In the case of applying a laser source known as a green laser which outputs a laser having the wavelength of 532 nm, in forming the first groove G1, the second groove G2, and the third groove G3, carbon, nickel oxide, iron oxide (III), or the like can be used as a filler. In the case of applying an IR laser which has the center wavelength in the infrared region, carbon, calcium sulfate, magnesium silicate, aluminum oxide, tungsten complex oxide, or the like can be used as a filler.

In the case in which the cover part 120 is formed by using a foamed plastic, the cover part 120 includes cells each having multiple pores, thereby naturally forming micro-protrusions and micro-depressions at the bottom of each groove. Thus, an improved anchoring effect between the cover part 120 and the first and second wiring 210 and 220 can be expected.

First Wiring and Second Wiring

The first wiring 210 and the second wiring 220 has conducting structures located in the grooves formed in the lower face 200b of the light emitting device 200. As shown in FIG. 1 and FIG. 2, the first wiring 210 includes a first part 211 and a second part 212, and the first part 211 and the second part 212 are respectively located in the first groove G1 and the second groove G2. The second wiring 220 is disposed in the third groove G3 formed separate from the first groove G1 and the second groove G2. As shown in FIG. 1, the first part 211 and the second part 212 of the first wiring 210 respectively have shapes that match the shapes of the first groove G1 and the second groove G2 in a bottom view. The second wiring 220 also has a shape that matches the shape of the third groove 3 in a bottom view. The shapes of the first wiring 210 and the second wiring 220 are merely examples, and the shapes of the first groove G1, the second groove G2, and the third groove G3 in a bottom view are not limited to the specific shapes.

In FIG. 2, the interface between the first wiring 210 and the bottom of the first groove G1, the interface between the first wiring 210 and the bottom of the second groove G2, and the interface between the second wiring 220 and the bottom of the third groove G3 are drawn as flat faces. However, the bottom face of the first wiring 210 and the bottom face of the second wiring 220 being flat is not essential in the embodiment of the present disclosure. For example, in the case of forming the first groove G1, the second groove G2, and the third groove G3 in the cover part 120 by way of laser beam irradiation, these surfaces of the grooves can have protrusions and depressions.

According to the embodiment of the present disclosure, a conducting material such as conductive paste is supplied in the first groove G1, the second groove G2, and the third groove G3 by printing, for example, can efficiently form the first wiring 210 and the second wiring 220. When the surfaces of the first groove G1, the second groove G2, and the third groove G3 have protrusions and depressions, a conducting material is supplied in the depressions formed in the cover part 120. Accordingly, the first wiring 210 and the second wiring 220 can have the bottom faces which include protrusions and depressions matched with the protrusions and depressions of the first groove G1, the second groove G2, and the third groove G3. By matching the shapes of the bottom faces of the first wiring 210 and the second wiring 220 to the protrusions and depressions of the groove surfaces formed in the cover part 120, a greater anchoring effect can be achieved. In other words, this can achieve the effect of reducing a possibility of the detachment of the first wiring 210 or the second wiring 220 from the light emitting device 200. As will be described later, the bottom faces of the first groove G1, the second groove G2, and the third groove G3 can each be formed as a structure structured with a plurality of grooves and the like.

The first groove G1, the second groove G2, and the third groove G3 each have, for example, a depth of 5 μm to 50 μm. In correspondence with such a depth the first groove G1, the second groove G2, and the third groove G3 can have, the first wiring 210 and the second wiring 220 can substantially have a thickness in the range of from 5 μm to 50 μm.

Embodiment of Method of Manufacturing Light Emitting Device

Figure 3:
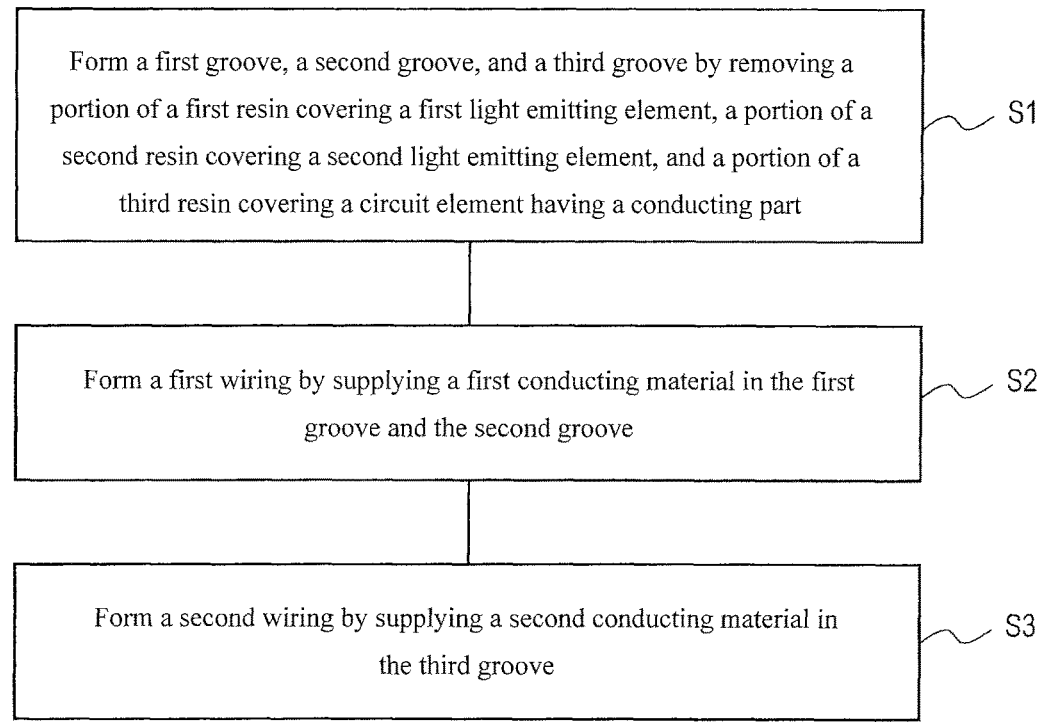
FIG. 3 is a flowchart of an exemplary method of manufacturing a light emitting device according to another embodiment of the present disclosure.

A method of manufacturing a light emitting device according to one embodiment of the present disclosure will be described below. FIG. 3 is a flowchart of an exemplary method of manufacturing a light emitting device. The manufacturing method described in FIG. 3 includes a step S1, a step S2, and a step S3. The step S1 is a process of forming a first groove, a second groove, and a third groove by removing a portion of a first resin that covers a first light emitting element, a portion of a second resin that covers a second light emitting element, and a portion of a third resin that covers a circuit element having a conducting part. The step S2 is a process of forming first wiring by supplying a first conducting material in the first groove and the second groove. The step S3 is a process of forming second wiring by supplying a second conducting material in the third groove. Each process will be explained in detail below.

Groove Forming Process

First, a first light emitting structure 100A that includes a first light emitting element 110A as a part thereof, a second light emitting structure 100B that includes a second light emitting element 110B as a part thereof, and a jumper element 250 are provided. The first light emitting structure 100A and/or the second light emitting structure 100B can be obtained as self-made components or through purchase. As described above, the first light emitting structure 100A and the second light emitting structure 100B can each constitute a structure that is usable as a light source by itself. For the first light emitting structure 100A and the second light emitting structure 100B, light sources that are commercially available under the name of LED packages or the like can be used.

For the jumper element 250, a circuit element including two terminal parts disposed apart by a distance with each being functional as a terminal, and a main body that electrically connects the terminal parts can be widely utilized. The example explained in the present embodiment uses the jumper member 250A shown in FIG. 2 as the jumper element 250.

Figure 4:
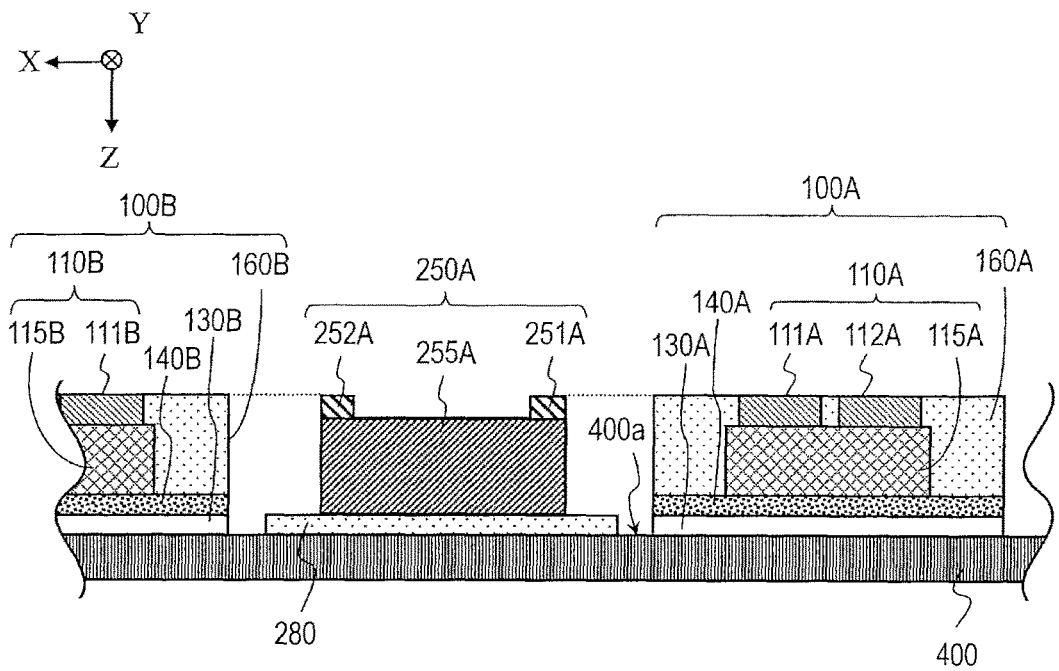
FIG. 4 is a schematic sectional view explaining the exemplary method of manufacturing a light emitting device.

Next, a support having an upper face is prepared (support providing process). In the present embodiment, as shown in FIG. 4, a support 400 having a flat upper face 400a is provided. For the support 400, for example, a heat-resistant adhesive tape supported by a ring frame or the like can be used.

Then the first light emitting structure 100A, the second light emitting structure 100B, and the jumper member 250A are disposed on the support. This process is also referred to as element disposing process. For simplification purposes, the example here arranges the first light emitting structure 100A, the jumper member 250A, and the second light emitting structure 100B one dimensionally in that order along the X direction indicated in the drawing. However, the number and the layout of the elements disposed on the support are not limited to those shown in the example. For example, three or more light emitting structures can be arranged two dimensionally on the support. In this case, the number and the layout of the jumper elements can be determined to conform to the number and the layout of the light emitting structures.

At this time, as schematically shown in FIG. 4, the first light emitting structure 100A is temporarily fixed to the upper face 400a of the support 400 while facing the first electrode 111A and the second electrode 112A away from the support 400. The second light emitting structure 100B is similarly temporarily fixed to the upper face 400a of the support 400 while facing the first electrode 111B and the second electrode 112B (not shown in FIG. 4) away from the support 400. In the present embodiment, the first light emitting structure 100A includes a stack configured as a first protective member 130A and a wavelength conversion member 140A, and the second light emitting structure 100B includes a stack configured as a second protective member 130B and a wavelength conversion member 140B. Accordingly, the first light emitting element 110A, the second light emitting element 110B are located above the upper face 400a of the support 400.

In this example, the lower faces of the first electrode 111A and the second electrode 112A of the first light emitting structure 100A are exposed from the reflecting resin member 160A, and the lower faces of the first electrode 111B and the second electrode 112B of the second light emitting structure 100B are also exposed from the reflecting resin member 160B. In the state where the first light emitting element 110A and the second light emitting element 110B are arranged above the support 400, the lower faces of the first electrode 111A and the second electrode 112A of the first light emitting element 110A and the lower faces of the first electrode 111B and the second electrode 112B of the second light emitting element 110B are located at substantially the same height using the upper face 400a of the support 400 as a reference.

In the present disclosure, the term "light emitting structure" is commonly used for a structure which includes a light emitting element with electrodes as a part of the structure regardless of whether the electrodes of the light emitting element are covered by or exposed from a resin that covers the light emitting element. In the state of being arranged on a support, the lower faces of electrodes (i.e., the surface farther from the support 400) being exposed from a reflecting resin member that covers the light emitting element is not essential to the embodiment of the present disclosure.

As shown in FIG. 4, the jumper member 250A is similarly arranged on the upper face 400a of the support 400 while facing the first terminal 251A and the second terminal 252A away from the support 400. In the present embodiment, however, the jumper member 250A is temporarily fixed to the support 400 while interposing a support member 280 between the upper face 400a of the support 400 and the jumper member 250A. In other words, in the present embodiment, the process of disposing a support member 280 on the upper face 400a of the support 400 (also referred to as support member disposing process) is performed before disposing the jumper member 250A.

The height of a jumper element and the height of a light emitting structure do not match in many cases. For example, a commercially available jumper chip can generally have a smaller thickness than a light emitting structure provided in the form of a package which includes a wavelength conversion member or the like in addition to a light emitting element. As indicated by dotted lines in FIG. 4, interposing a support member 280 having an appropriate thickness between the support 400 and the jumper member 250A can bring the positions of the lower faces of the first terminal 251A and the second terminal 252A to substantially the same the positions of the lower faces of the of the first electrode 111a and the second electrodes 112A as well as the lower faces of the first electrode 111B and the second electrode 112B (not shown in FIG. 4).

For the support member 280, a member having the height equivalent to the difference between the height of a light emitting structure and the height of the jumper member 250A can suitably be used. Typically, the support member 280 has insulation properties, but a conducting member can be applied as the support member 280. Examples of a support member 280 include a resin sheet, resin block, metal sheet, and the like. The jumper member 250A is fixed to the support member 280 using, for example, an adhesive.

Figure 5:
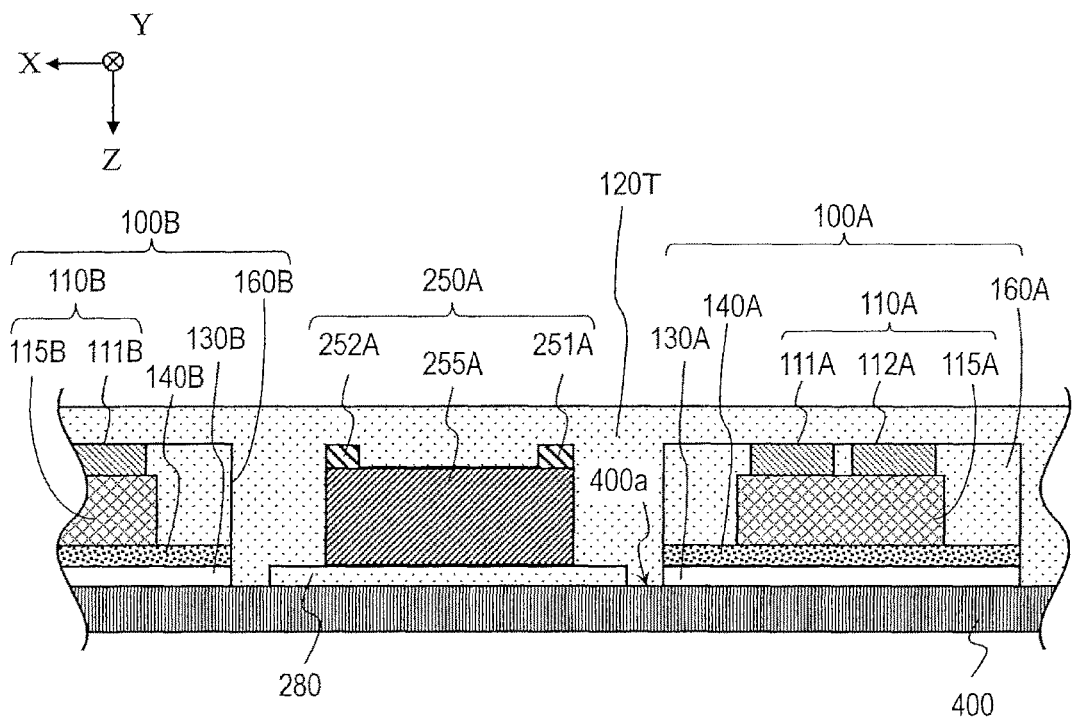
FIG. 5 is a schematic sectional view explaining the exemplary method of manufacturing a light emitting device.

Then, as shown in FIG. 5, a resin material is supplied in the regions of the upper face 400a of the support 400 that are between the first light emitting structure 100A and the jumper member 250A, and between the second light emitting structure 100B and the jumper member 250A. The resin material is subsequently hardened, and then a resin layer 120T collectively covering the first light emitting structure 100A, the second light emitting structure 100B, and the jumper member 250A can be obtained.

In the structure illustrated in FIG. 5, the resin layer 120T covers the entire first light emitting structure 100A, the entire second light emitting structure 100B, and the entire jumper member 250A except for the portions that are in contact with the support 400 or the support member 280. This process is also referred to as a covering process. This can produce a structure integrating the first light emitting structure 100A, the second light emitting structure 100B, and the jumper member 250 on the support 400.

For the material employed for the resin layer 120T, one similar to the material for forming the reflecting resin member 160A or the reflecting resin member 160B can be used. The resin layer 120T forming process can be performed by applying transfer forming, spray coating, compression molding, or the like. In the case of forming the resin layer 120T, the reflecting resin member 160A, and the reflecting resin member 160B with a common material, no clear borders may be recognized between the first light emitting structure 100A and the resin layer 120T and between the second light emitting structure 100B and the resin layer 120T in a sectional view. In the case of forming the resin layer 120T and the support member 280 with a common material, similarly, a clear border may not be seen between the support member 280 and the resin layer 120T. An example in which the resin layer 120T and the support member 280 are formed from the same material will be explained below.

Figure 6:
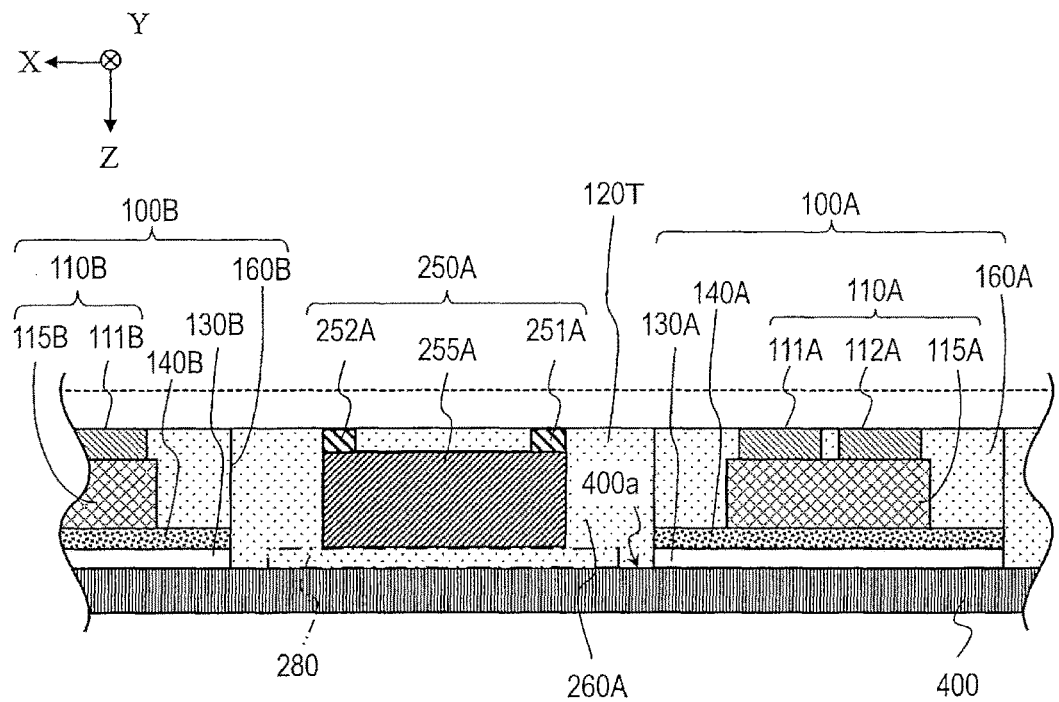
FIG. 6 is a schematic sectional view explaining the exemplary method of manufacturing a light emitting device.

As schematically shown in FIG. 6, the thickness of the resin layer 120T is reduced by partially removing the resin layer 120T as needed by grinding or the like from the side opposite to the support 400. In the present embodiment, partially removing the resin layer 120T allow the lower faces of the first electrode 111A and the second electrode 112A of the first light emitting structure 100A, the lower faces of the first electrode 111B and the second electrode 112B (not shown in FIG. 6) of the second light emitting structure 100B, and the lower faces of the first terminal 251A and the second terminal 252A of the jumper member 250A to be exposed from the resin layer 120T. As will be described later, it is not essential for the lower faces of the first electrode 111A, the second electrode 112A, the first electrode 111B, the second electrode 112B, the first terminal 251A, and the second terminal 252A to be exposed from the resin layer 120T in the embodiment of the present disclosure.

Partially removing the resin layer 120T results in forming a reflecting resin member 260A that covers at least the jumper member 250A on the support 400. This process is also referred to as a third resin forming process. In this example, the support member 280 constitutes a part of the reflecting resin member 260A explained with reference to FIG. 2.

Figure 7:
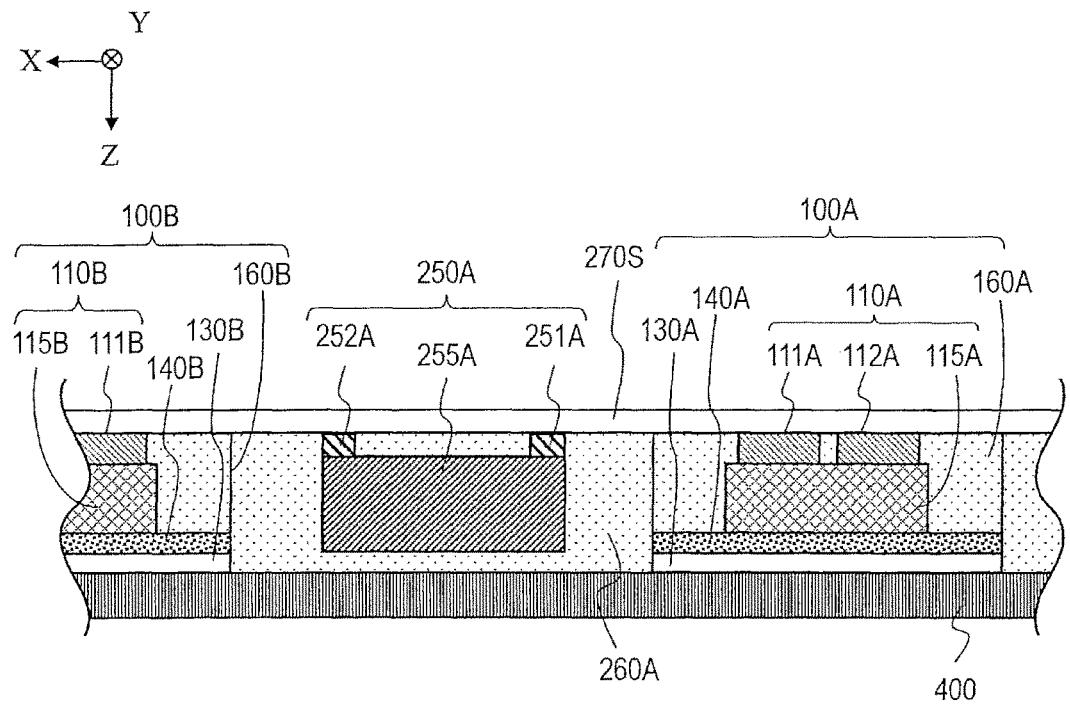
FIG. 7 is a schematic sectional view explaining the exemplary method of manufacturing a light emitting device.

In the present embodiment, after removing a portion of the resin layer 120T, a resin layer 270S is disposed on the surface of the structure on the support 400 as shown in FIG. 7. For the resin layer 270S, for example, a resin tape having an adhesive layer can be used. After adhering the resin tape to the surface of the resin layer 120T which has been subjected to grinding, the adhesive layer of the resin tape is hardened by heating, UV irradiation, or the like. Alternatively, the resin layer 270S can be formed by disposing a resin sheet having a predetermined thickness on the structure on the support 400 by using an adhesive or the like. The thickness of the resin layer 270S is typically in the range of from 5 μm to 100 μm.

In the structure illustrated in FIG. 7, the resin layer 270S is a single resin member continuous across the first light emitting structure 100A, the second light emitting structure 100B, and the reflecting resin member 260A. In this description, being "single" is not intended to limit the resin layer 270S to a single layer, and the resin layer 270S can be provided in the form of a multilayer sheet. The resin layer 270S can be a light transmissive sheet, or a sheet that appears white, for example, by containing a pigment or the like dispersed therein.

Figure 8:
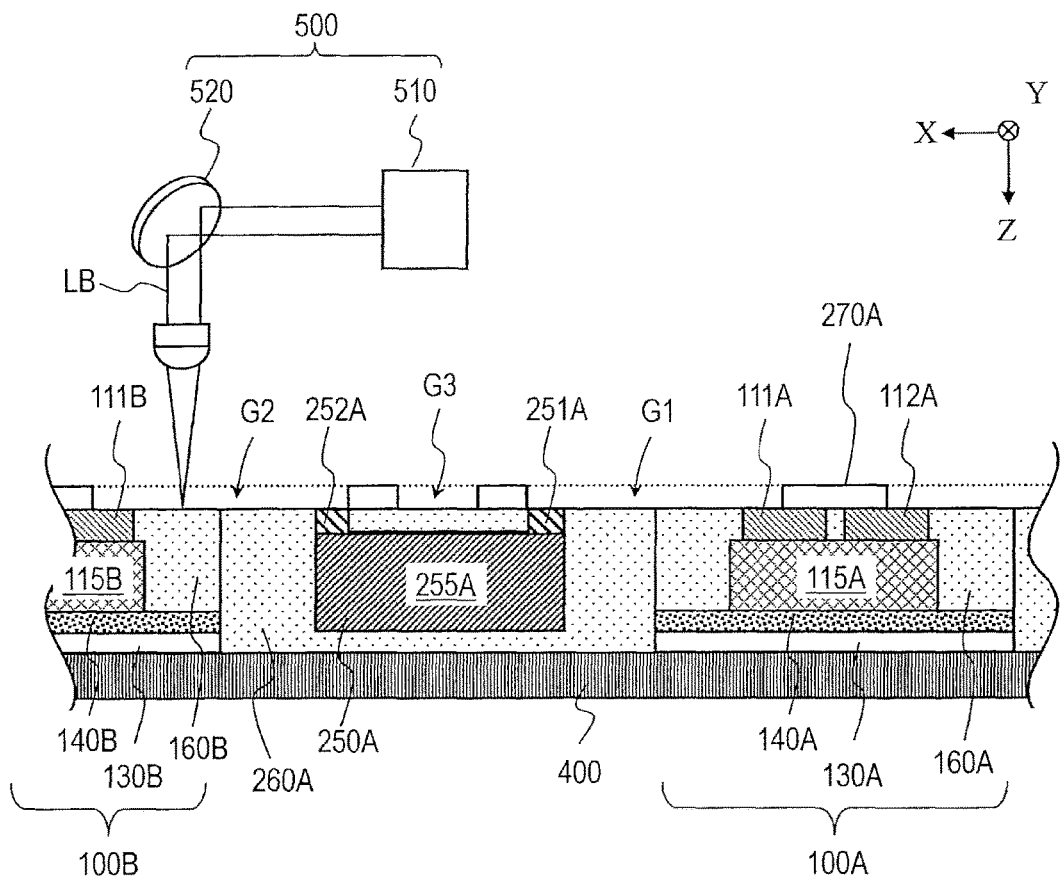
FIG. 8 is a schematic sectional view explaining the exemplary method of manufacturing a light emitting device.

Subsequently, a first groove, a second groove, and a third groove are formed by removing certain portions of the resin layer 270S (step S1 in FIG. 3). In the present disclosure, as schematically shown in FIG. 8, the portions of the resin layer 270S are removed by laser beam irradiation.

For laser beam irradiation, a known laser ablation equipment can be applied. In FIG. 8, an application example of laser ablation equipment 500 which includes a laser source 510 and a galvanometer mirror 520. The number of galvanometer mirrors in the laser ablation equipment can be two or more. Examples of laser sources 510 include $CO_2$ laser, Nd:YAG laser, Nd:$YVO_4$ laser, argon ion laser, and the like. Alternatively, a green laser can be used as the laser source 510. The laser ablation equipment 500 can be equipped with a fiber laser. It is also possible to process the resin layer 270S by using second and third harmonics generated by a high harmonic generator utilizing SHG, THG, and the like.

Predetermined regions of the resin layer 270S can be selectively removed by scanning the surface of the resin layer 270S with a laser beam LB. Assuming that the portions of the resin layer 270S that cover the first light emitting structure 100A, the second light emitting structure 100B, and the jumper member 250A are respectively referred to as a first resin, a second resin, and a third resin, at least a portion of the first resin, a portion of the second resin, and a portion of the third resin of the resin layer 270S are removed. Accordingly, as shown in FIG. 8, a resin layer 270A provided with a first groove G1, a second groove G2, and a third groove G3 can be formed in the structure on the support 400 on the side opposite to the support 400. By forming the resin layer 270A, a cover part 120 that collectively covers the first light emitting element 110A, the second light emitting element 110B, and the jumper element 250 can be obtained. In this example, the cover part 120 can be considered as a light reflecting structure having the reflecting resin member 160A, the reflecting resin member 160B, and the reflecting resin member 260A as parts thereof.

In the process of forming a first groove G1, a second groove G2, and a third groove G3, the portion of the first resin located above the first electrode 111A, the portion of the second resin located above the first electrode 111B, and the portions of the third resin located above the first and second terminals 251A and 252A are removed. In other words, laser beam irradiation is applied to expose at least a portion of the first electrode 111A and at least a portion of the second electrode 112A of the first light emitting element 110A, at least a portion of the first electrode 111B and at least a portion of the second electrode 112B of the second light emitting element 110B, and at least a portion of the first terminal 251A and at least a portion of the second terminal 252A of the jumper member 250A. At this time, it is fine if portion(s) of the surfaces of the electrodes of the light emitting elements and/or portion(s) of the surfaces of the terminals of the jumper element are removed together with the portions of the resin layer 270S.

In the case of forming the first groove G1, the second groove G2, and the third groove G3 by laser beam irradiation, laser beam scanning can be repeated along a certain direction in the XY plane indicated in the drawing, for example. Such irradiation can form a plurality of fine grooves each elongated along the scanning direction. The first groove G1, the second groove G2, and the third groove G3 can each be structured by forming such fine grooves along a different direction from the scanning direction.

The first groove G1, the second groove G2, and the third groove G3 can be formed by applying laser pulse irradiation in a different direction from both the X and Y directions indicated in the drawing so as to allow laser spots to partially overlap. The laser beam scanning direction, of course, can be appropriately determined. As such, the laser beam scanning direction can coincide with the X or Y direction. Examples of laser beam irradiation conditions are listed below.

Peak wavelength of laser beam: 532 nm
Laser output: 2.4 W
Pulse width: 100 nanoseconds
Frequency: 50 kHz
Moving speed: 200 mm/s
Defocus: 0 μm
Fine groove pitch: 15 μm or 30 μm The direction in which each of the first groove G1, the second groove G2, and the third groove G3 is elongated is not restricted by the laser beam scanning direction. In other words, a high degree of design flexibility can be achieved for the shapes of not only the first, second and third grooves G1, G2, G3, but also the wiring formed in the grooves. Moreover, allowing fine grooves to collectively form the first groove G1, the second groove G2, and the third groove G3 can form micro-protrusions and micro-depressions at the bottoms of the grooves, thereby producing a more enhanced anchoring effect between the cover part 120 and the later described first and second wiring 210 and 220.

Subsequent to multiple laser beam scanning along one direction, the bottoms of the first groove G1, the second groove G2, and the third groove G3 can be subjected to further laser beam irradiation using a different irradiation pattern. For example, after performing a first round of laser beam scanning along one direction, a second round of laser beam scanning can be performed along another direction to thereby form a plurality of fine grooves intersecting the fine grooves formed by the first round of laser beam scanning. Alternatively, after a first round of laser beam scanning, laser beam irradiation using a dot pattern can be performed. This can form a plurality of relatively deep dot-shaped depressions at the bottoms of the first groove G1, the second groove G2, and the third groove G3. A "different irradiation pattern" in the description herein is not limited to an operation involving a different trail of laser spot movements, but should be broadly interpreted as including operations such that, between the first round of laser irradiation and the second round of laser irradiation, the laser output, the pulse interval, or the like are varied while sharing the same trails of laser spots (or the trails of relative movement of the laser head with respect to the stage). An improved anchoring effect can be expected from further laser beam irradiation using a second irradiation pattern different from a first irradiation pattern.

In the embodiment of the present disclosure, exposure of the electrodes of the light emitting elements (i.e., the first electrodes 111A and 111B, and the second electrodes 112A and 112B) and the terminals of the jumper element (i.e., the first terminal 251A and the second terminal 252A) in the state before forming the first groove G1, the second groove G2, and the third groove G3 is not necessarily required. For example, the electrodes of the light emitting elements and the terminals of the jumper element can be covered by a white resin layer or the like before laser beam irradiation. The resin layer 270S can be, for example, a white resin sheet or the like as long as the positions of the electrodes of the light emitting elements and the terminals of the jumper element are detectable by means of an image recognition technique or the like.

As shown in FIG. 8, the first groove G1 is disposed straddling the first resin and the third resin, and the second groove G2 is disposed straddling the second resin and the third resin. At least one portion of the third groove G3 is formed in the third resin, and includes the portion elongated between the first groove G1 and the second groove G2 in a bottom view. As shown in FIG. 8, at least one portion of the first electrode 111A of the first light emitting structure 100A and at least one portion of the first terminal 251A of the jumper member 250A are exposed in the first groove G1. Moreover, at least one portion of the first electrode 111B of the second light emitting structure 100B and at least one portion of the second terminal 252A of the jumper member 250A are exposed in the second groove G2.

First Wiring Forming Process

Subsequently, first wiring which includes multiple independent parts is formed (step S2 in FIG. 3) by supplying a first conducing material in the first groove G1 and the second groove G2. As schematically shown in FIG. 9, an example shown here supplies a conductive paste 20 as a first conducting material in the first groove G1 and the second groove G2 by printing using a squeegee 390.

For the conductive paste 20, a base material configured as an epoxy resin or the like containing particles such as Au, Ag, Cu, or the like, dispersed therein can be used. For example, any known Au paste, Ag paste, or Cu paste can be used as the conductive paste 20. The conductive paste 20 can contain a solvent. Instead of the conductive paste 20, for example, an alloy material such as Sn—Bi-based solder containing copper powder can be used as the conducting material.

Figure 9:
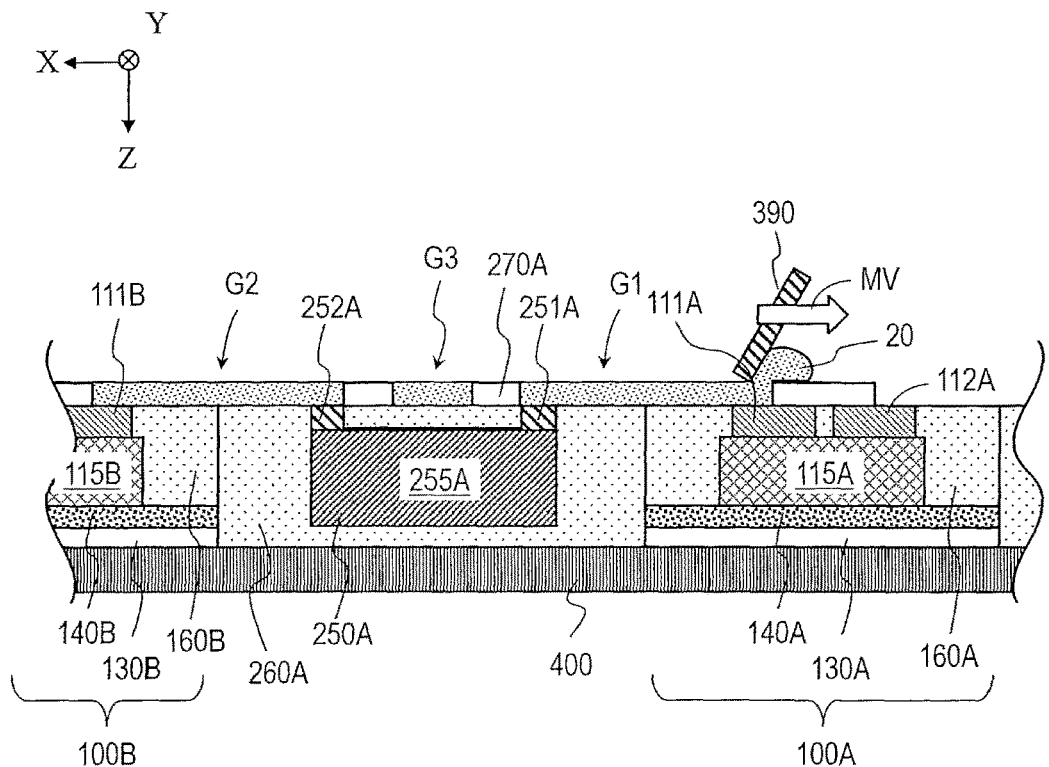
FIG. 9 is a schematic sectional view explaining the exemplary method of manufacturing a light emitting device.

A conductive paste 20 is supplied to the first groove G1 and/or the second groove G2, or on the resin layer 270A, and a squeegee 390 is moved on the surface of the resin layer 270A as indicated by the outlined arrow MV in FIG. 9. At this time, a portion of the conductive paste 20 enters into the first groove 1 and the second groove G2, thereby obtaining the first groove G1 and the second groove G2 in which the conductive paste 20 is entered.

Subsequently, the conductive paste 20 supplied in the first groove G1 and the second groove G2 is hardened by heating or irradiation of light. As in the example shown in FIG. 2, the hardened conductive paste 20 is configured as the first wiring 210 that includes the first part 211 having the shape that matches the shape of the first groove G1 and the second part 212 having the shape that matches the shape of the second groove G2 in a bottom view. In this example, the first part 211 of the first wiring 210 is formed in the first groove G1 and the second part 212 of the first wiring 210 in the second groove G2 with the hardened conductive paste 20.

Second Wiring Forming Process

In this example, furthermore, in parallel with supplying the first conducting material in the first groove G1 and the second groove G2, a second conducting material is supplied in the third groove G3 by printing using the squeegee 390. In this example the conductive paste 20 that is the first conducting material is also used as the second conducting material. The second wiring 220 can be formed by hardening the conductive paste 20 to be the second conducting material in the third groove G3 (step S3 in FIG. 3). There is no particular restriction in the order between supplying the first conducting material in the first groove G1 and the second groove G2, and supplying the second conducting material in the third groove G3.

The second wiring 220 is electrically separated from the first wiring 210 described above by being spatially separated by the resin layer 270A. The example explained in this example uses the same conductive paste 20 for both the second conducting material and the first conducting material. It is needless to say, however, that a different material from a material for the first conducting material can be used for the second conducting material. Using the same material for both the second conducting material and the first conducting material makes it easy to simultaneously perform the first wiring forming process and the second wiring forming process. Simultaneously performing the first wiring forming process and the second wiring forming process can more efficiently manufacture a light emitting device 200.

The method of supplying the conductive paste 20 is not limited to one that uses a squeegee. Various printing methods, including spin coating, dip coating, screen printing, offset printing, flexographic printing, gravure printing, microcontact printing, inkjet printing, nozzle printing, aerosol jet printing, and the like can be used. Of course, the conductive paste 20 can be applied to the first groove G1, the second groove G2, and the third groove G3 using a method other than printing methods.

In this example, the conductive paste 20 is applied to the first groove G1, the second groove G2, and the third groove G3 by printing using a squeegee 390. The portion of the conductive paste 20 bulging on the surface of the resin layer 270A is substantially leveled out by moving the squeegee 390. Accordingly, the positions of the surfaces of the first wiring 210 and the second wiring 220 are substantially flush with the surface of the resin layer 270A, i.e., the lower face of the cover part 120. However, a grinding process can be additionally performed after the conductive paste 20 is hardened as necessary. For example, the surface of the hardened conductive paste 20 and the surface of the resin layer 270A can be ground by using a grinding wheel. Grinding can make the surfaces of the first wiring 210 and the second wiring 220 which are subjected to grinding flush with the lower face 200b of the light emitting device 200. This can also remove the residues of the conductive paste 20 adhered to the surface of the resin layer 270A. A layer of copper plating or nickel-gold plating can be formed on the hardened conductive paste 20 as necessary. Performing the processes described above, a structure similar to the light emitting device 200 shown in FIG. 1 and FIG. 2 can be produced.

Variation of Method of Manufacturing Light Emitting Device

A variation of the method of manufacturing a light emitting device will be explained below. In the example described above, a resin layer 120T integrally covering the first light emitting element 110A, the second light emitting element 110B, and the jumper member 250A is formed, followed by exposing the electrodes of the light emitting elements (i.e., the first electrodes 111A and 111B, and the second electrodes 112A and 112B) and the terminals of the jumper element (i.e., the first terminal 251A and the second terminal 252A) by grinding or the like, and then disposing a resin layer 270S to cover the electrodes and the terminals. However, as explained below, it is not essential to further dispose a resin layer 270S on the resin layer 120T in the embodiment of the present disclosure.

Figure 10:
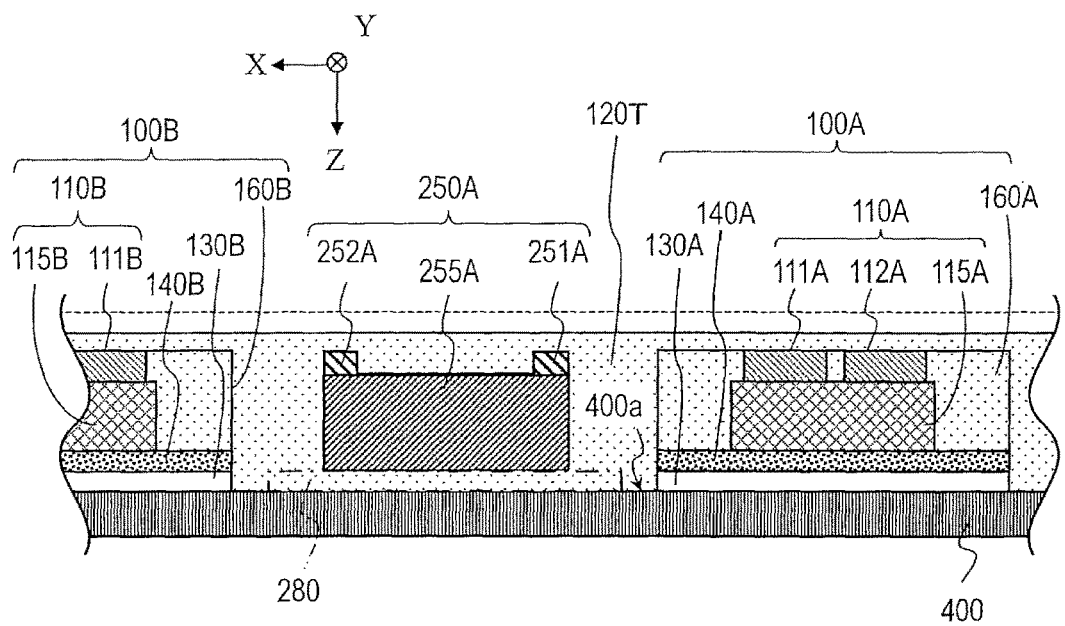
FIG. 10 is a schematic sectional view explaining a first variation of the method of manufacturing a light emitting device.

FIG. 10 schematically shows a variation of the manufacturing process. In the example explained here, the processes up to the formation of a resin layer 120T can basically be the same or similar to in the example described above. After forming the resin layer 120T, a portion of the resin layer 120T is removed from the side opposite to the support 400 by grinding or the like in a similar manner to in the example explained with reference to FIG. 6. In this example, however, the electrodes of the light emitting elements (i.e., the first electrodes 111A and 111B, and the second electrodes 112A and 112B) and the terminals of the jumper element (i.e., the first terminal 251A and the second terminal 252A) are left in the state of being covered by the resin layer 120T. In other words, portions of the resin layer 120T still remain on the electrodes of the light emitting elements and the terminals of the jumper element. The distance from the surfaces of the electrodes of the light emitting elements or the surfaces of the terminals of the jumper member to the surface of the resin layer 120T after grinding (i.e., the ground surface) can be in the range of from 5 μm to 100 μm, for example.

Figure 11:
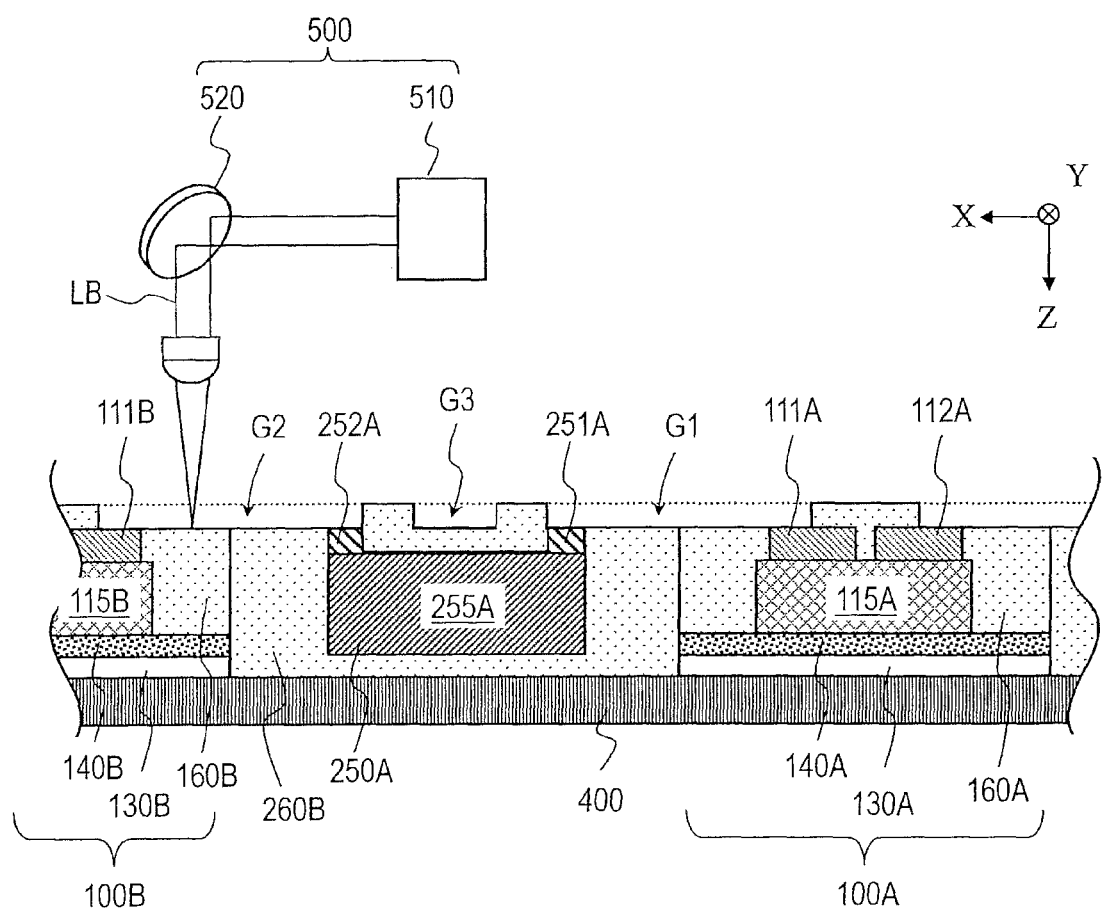
FIG. 11 is a schematic sectional view explaining the first variation of the method of manufacturing a light emitting device.

Subsequently, the resin layer 120T is partially removed from the side opposite to the support 400 by laser beam irradiation, for example, in a similar manner to in the example explained with reference to FIG. 8. The portions of the resin layer 120T covering the first light emitting structure 100A, the second light emitting structure 100B, and the remaining portion are respectively referred to as a first resin, a second resin, and a third resin. As shown in FIG. 11, a portion of the first resin, a portion of the second resin, and a portion of the third resin are removed by laser beam LB scanning using, for example, laser ablation equipment 500. This can form a first groove G1, a second groove G2 and a third groove G3 on the side opposite to the support 400 similar to in the example shown in FIG. 8, thereby producing a similar structure to the cover part 120 shown in FIG. 1. Similar to in the example shown in FIG. 8, at least a portion of the first electrode 111A of the first light emitting structure 100A and at least a portion of the first terminal 251A of the jumper member 250A are exposed in the first groove G1, and at least a portion of the first electrode 111B of the second light emitting structure 100B and at least a portion of the second terminal 252A of the jumper member 250A are exposed in the second groove G2.

After partially removing the third resin forms on the support 400 a reflecting resin member 260B that covers at least the jumper member 250A. The reflecting resin member 260B is provided with a third groove G3 on the face opposite to the support 400. In other words, the reflecting resin member 260B includes a portion located in the −Z direction in the drawing relative to the surfaces of the terminals of the jumper element (in this example, the first terminal 251A and the second terminal 252A). In this example, as schematically shown in FIG. 11, the resin layer 120T includes portions that are located in the −Z direction in the drawing with respect to the surface of an electrode of a light emitting element.

Focusing on the first resin covering the first light emitting structure 100A, for example, the first resin includes a portion located in the −Z direction in the drawing with respect to the surfaces of the first electrode 111A and the second electrode 112A of the first light emitting element 110A. In the case in which the resin layer 120T and the reflecting resin member 160A employ a common material, a clear boundary may not be recognized between the reflecting resin member 160A and the portion of the first resin that is positioned in the −Z direction in the drawing with respect to the surfaces of the first electrode 111A and the second electrode 112A. In such a case, the portion of the first resin that is positioned in the −Z direction in the drawing with respect to the surfaces of the first electrode 111A and the second electrode 112A can be considered as a part of the reflecting resin member 160A. Similarly, the portion of the second resin that is positioned in the −Z direction in the drawing with respect to the surfaces of the first electrode 111B and the second electrode 112B of the second light emitting element 110B can be considered as a part of the reflecting resin member 160B.

Figure 12:
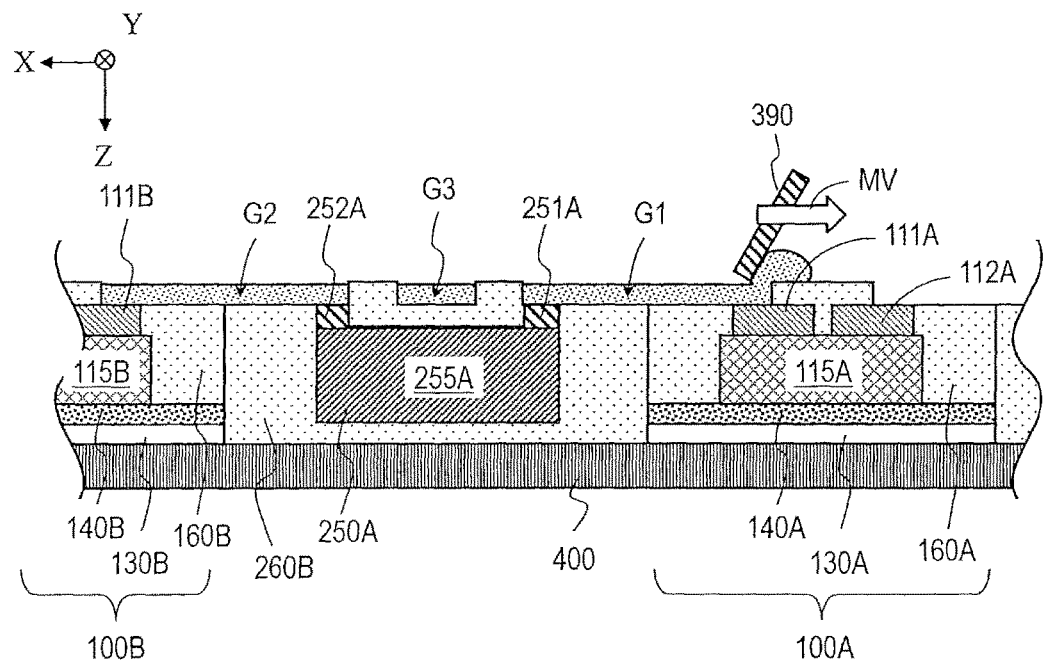
FIG. 12 is a schematic sectional view explaining the first variation of the method of manufacturing a light emitting device.

Subsequently, in a similar manner to in the example explained with reference to FIG. 9, a conductive paste 20 is supplied in the first groove G1 and the second groove G2, as shown in FIG. 12, by printing, for example. At this time, the supply of a first conducting material in the first groove G1 and the second groove 2, and the supply of a second conducting material in the third groove G3 can be simultaneously performed.

Subsequently, the conductive paste 20 supplied in the first groove G1, the second groove G2, and the third groove G3 is hardened by heating or irradiation of light, thereby forming first wiring 210 having the shape that matches the shape of the first groove G1 and the second groove G2 in a bottom view and second wiring 220 having the shape that matches the shape of the third groove G3 in a bottom view with the conductive paste 20. After hardening the conductive paste 20, the surface of the hardened conductive paste 20 can be ground and/or a layer of plating can be formed on the surface of the hardened conductive paste 20 as necessary.

Figure 13:
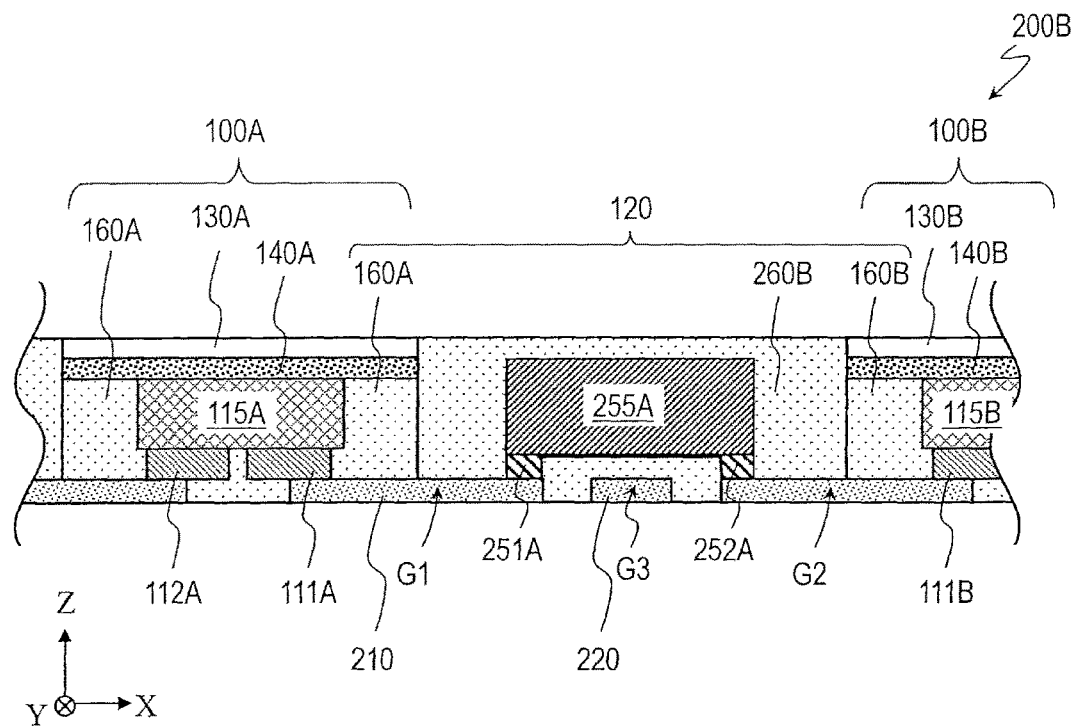
FIG. 13 is a schematic sectional view of a light emitting device 200B obtained by the manufacturing method shown in FIG. 10 to FIG. 12.

The light emitting device 200B shown in FIG. 13 can be obtained when separated from the support 400. In the structure illustrated in FIG. 13, the cover part 120 includes a reflecting resin member 160A that covers the first light emitting element 110A, a reflecting resin member 260B that covers the jumper member 250A, and a reflecting resin member 160B that covers the second light emitting element 110B, as parts thereof.

Figure 14:
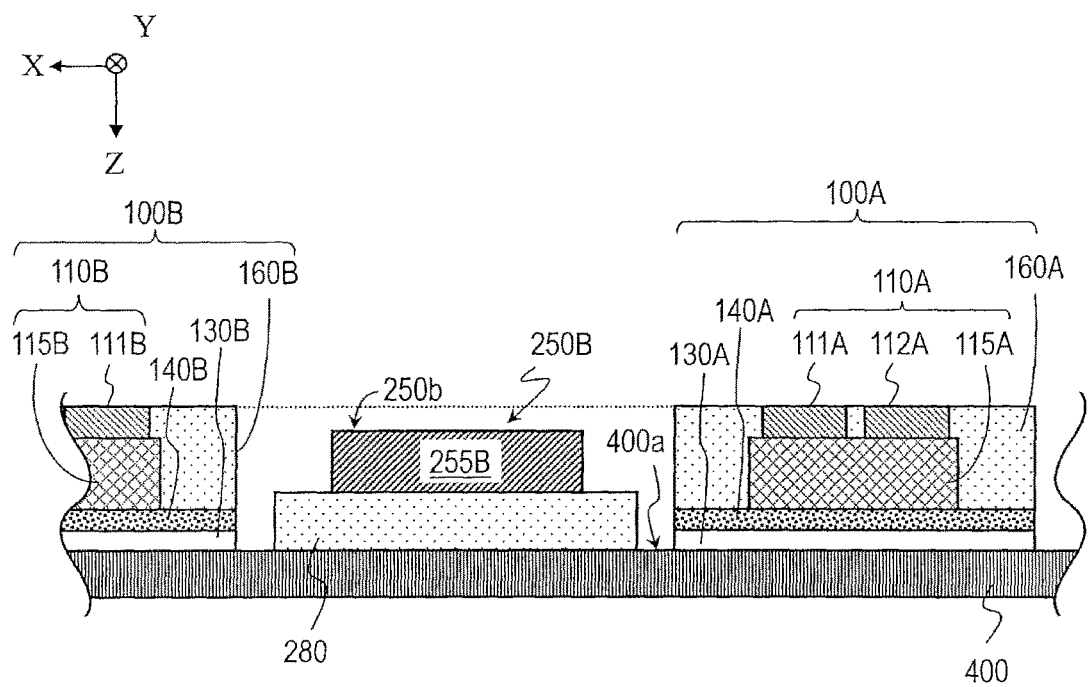
FIG. 14 is a schematic sectional view explaining a second variation of the method of manufacturing a light emitting device.

FIG. 14 schematically shows another variation of the method of manufacturing a light emitting device. In an example FIG. 4 as compared to the example explained with reference to FIG. 4, a jumper member 250B, which has a main body 255B, as a jumper element 250 is disposed between a first light emitting structure 100A and a second light emitting structure 100B. In this example, the main body 255B is a member that is conductive at least on the surface opposite to the support 400. The main body 255B can be a conducting member such as a metal sheet. As indicated by a dotted line in FIG. 14, the surface of the main body 255B opposite to the support 400 (hereinafter also referred to as the "lower face 250b") in this example is located at a lower position than the lower face of the first light emitting structure 100A and the lower face of the second light emitting structure 100B (i.e., located in the +Z direction in the drawing with respect to the lower face of the first light emitting structure 100A and the lower face of the second light emitting structure 100B).

Figure 15:
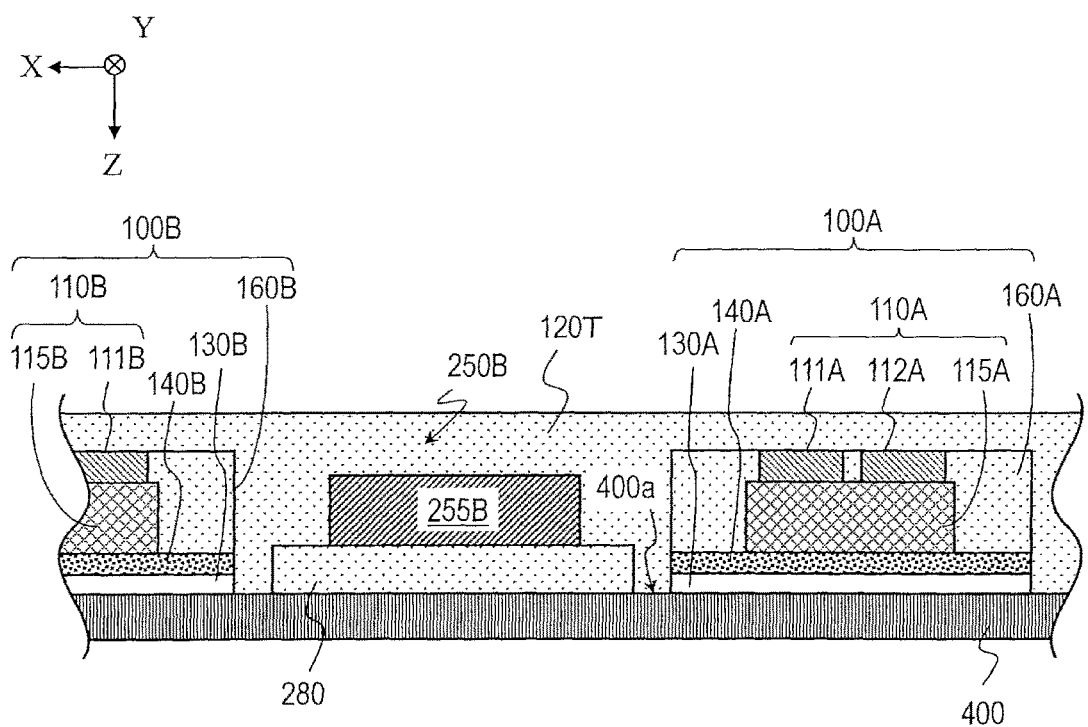
FIG. 15 is a schematic sectional view explaining the second variation of the method of manufacturing a light emitting device.

After arranging a first light emitting structure 100A, a second light emitting structure 100B, and a jumper member 250B on the support 400, a resin material is applied on the support 400 to cover these entirely. By hardening the resin material, a resin layer 120T covering the members entirely can be formed as shown in FIG. 15. The thickness of the resin layer 120T can be reduced to a prescribed height by grinding or the like as necessary. The entire jumper member 250B is covered with the material employed for the resin layer 120T by this process (also referred to as covering process). In this example, similar to the example explained with reference to FIG. 10, the electrodes of the light emitting elements (i.e., the first electrodes 111A and 111B, and the second electrodes 112A and 112B) are covered by the resin layer 120T.

Figure 16:
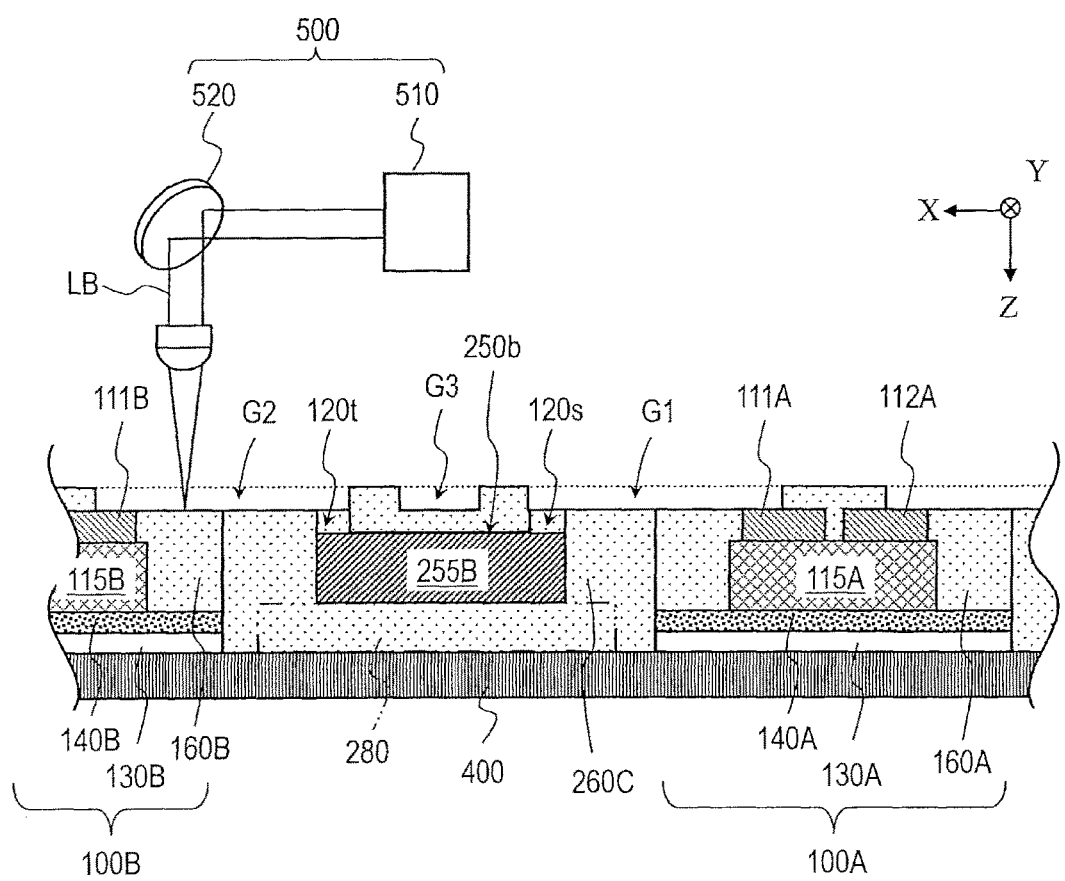
FIG. 16 is a schematic sectional view explaining the second variation of the method of manufacturing a light emitting device.

Then the groove forming process described above is performed. In this example, as schematically shown in FIG. 16, a first groove G1, a second groove G2, and a third groove G3 are formed by subjecting the surface of the resin layer 120T to laser beam LB scanning. At this time, the first groove G1 and the second groove G2 are formed into shapes each partially overlapping with the jumper member 250B in a bottom view. At this point, moreover, in parallel with the formation of the first groove G1, the second groove G2, and the third groove G3, for example, a first hole 120s and a second hole 120t reaching the main body 255B of the jumper member 250B are formed in the resin layer 120T (also referred to as hole forming process).

The first hole 120s is formed at a location that overlaps the area near an edge of the lower face 250b of the jumper member 250B in a bottom view, and the second hole 120t is formed at a location closer to the first electrode 111B of the second light emitting element 110B than the first hole 120s. Formation of the first hole 120s and the second hole 120t can be performed in parallel with the formation of the first groove G1, the second groove G2, and the third groove G3, or performed after the formation of the first groove G1 and the second groove G2. In the latter case, the first hole 120s and the second hole 120t are respectively located in the first groove G1 and the second groove G2. With the formation of the first hole 120s and the second hole 120t, a reflecting resin member 260C covering the jumper member 250B is formed as a portion of the resin layer 120T. As a result, a cover part 120 which collectively covers the first light emitting element 110A, the second light emitting element 110B, and the jumper member 250B, is formed on the support 400. In this example, the reflecting resin member 260C includes a support member 280 as a part thereof.

Subsequently, the first wiring forming process and the second wiring forming process described above are performed. For example, a conductive paste 20 is supplied in the first groove G1, the second groove G2, and the third groove G3 using a squeegee 390. At this time, as schematically shown in FIG. 17, the conductive paste 20 can also be supplied in the first hole 120s and the second hole 120t.

Subsequently, the conductive paste 20 is hardened. The hardened conductive paste 20 is configured as the first wiring 210 in the first groove G1 and the second groove G2, as well as the second wiring 220 in the third groove G3. At this time, the portion of the conductive paste 20 located in the first hole 120s is configured as a first via 251B in the first hole 120s by hardening, and the portion of the conductive paste 20 located in the second hole 120t is configured as a second via 252B is formed in the second hole 120t by hardening. This process is also referred to as a via forming process.

Figure 17:
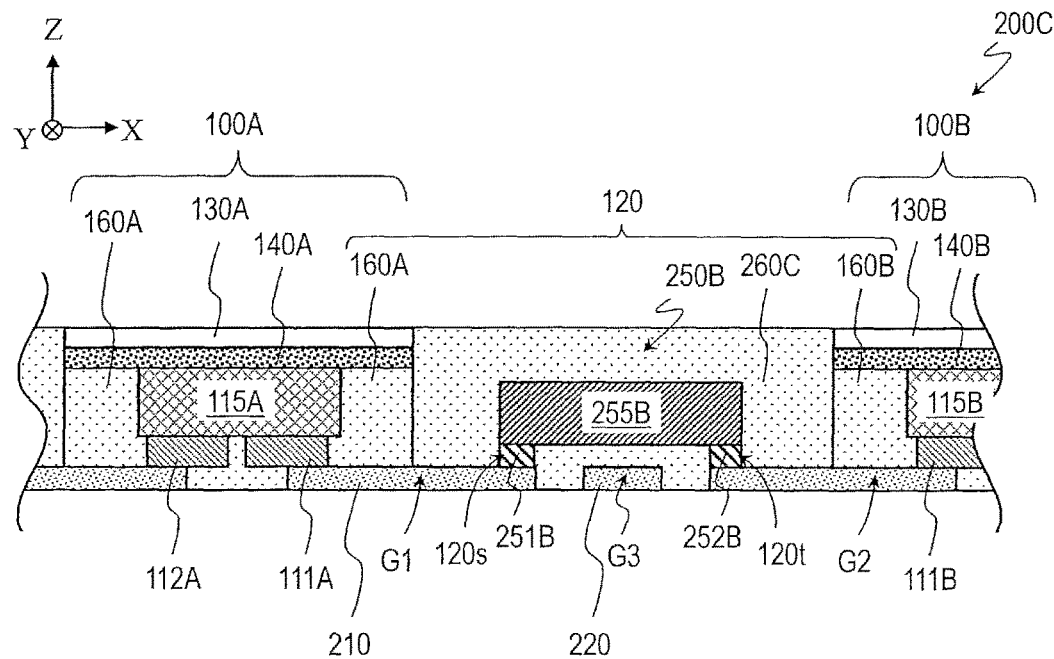
FIG. 17 is a schematic sectional view of a light emitting device 200C obtained by the manufacturing method shown in FIG. 14 to FIG. 16.

As shown in FIG. 17, the first via 251B occupies the first hole 120s, and the second via 252B occupies the second hole 120t. The first via 251B and the second via 252B respectively function as the first terminal and the second terminal of the jumper member 250B, as they are connected to the jumper member 250B. The first terminal and the second terminal are electrically connected to one another via the main body 255B. In other words, by forming the first via 251B and the second via 252B, a jumper element having the first via 251B and the second via 252B as its terminals can be formed in the cover part 120.

It is not essential that formation of the first via 251B and the second via 252B is performed in parallel with the formation of the first wiring 210. For example, after forming the first hole 120s and the second hole 120t, a conducting material can be disposed in the holes by printing, sputtering, or the like to thereby form the first via 251B and the second via 252B before forming the first wiring 210. By forming the terminals of the jumper element after forming the cover part 120, an intersection of wiring can be achieved using an inexpensive and generally available member such as a metal plate or the like without using a specially prepared jumper member.

The subsequent processes are substantially the same or similar to in the examples already explained, for which the explanation will be omitted. By following the processes described above, the light emitting device 200C shown in FIG. 17 can be obtained. In this example, the cover part 120 includes a reflecting resin member 160A that covers the first light emitting element 110A, a reflecting resin member 260C that covers the jumper member 250B, and a reflecting resin member 160B that covers the second light emitting element 110B, as parts thereof.

As is understood from each example described above, in a manufacturing method according to any embodiment of the present disclosure, a circuit element having a main body that includes a conducting part and terminals that are arranged apart from one another and connected to the conducting part can be widely utilized as the jumper element. For example, a Zener diode serving as a protective device can also be utilized as a jumper element. Alternatively, as explained below, a so-called jumper chip can be utilized to form an intersection between the first wiring 210 and the second wiring 220.

Figure 18:
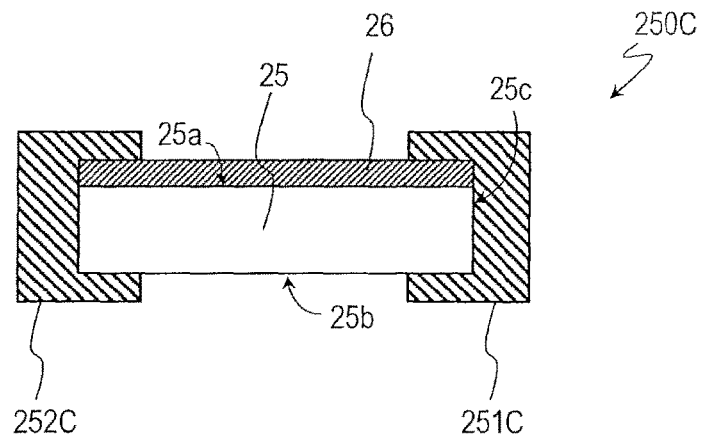
FIG. 18 is a schematic sectional view of one example of a jumper chip as a jumper element applicable to the embodiments of the present disclosure.

FIG. 18 shows one example of a jumper chip employed as a jumper element. The jumper chip 250C shown in FIG. 18 includes a plate-shaped base 25 made of a ceramic material such as alumina, a conducting layer 26 disposed on one of the primary faces of the base 25, and a first and second terminals 251C and 252C respectively provided at the ends of the base 25. As shown in the drawing, the first terminal 251C is positioned at one end of the base 25, and the second terminal 252C is positioned at the opposite end of the base 25. Each of the first terminal 251C and the second terminal 252C is formed on the base 25 from the upper face 25a to the lower face 25b of the base 25 so as to cover a lateral face 25c, and is electrically connected to the conducting layer 26 disposed on the upper face 25a of the base 25. In the structure shown in FIG. 18, the conducting layer 26 is selectively formed on the upper face 25a of the two primary faces of the base 25. However, the structure can have conductive layers 26 on both faces of the base 25.

Figure 19:
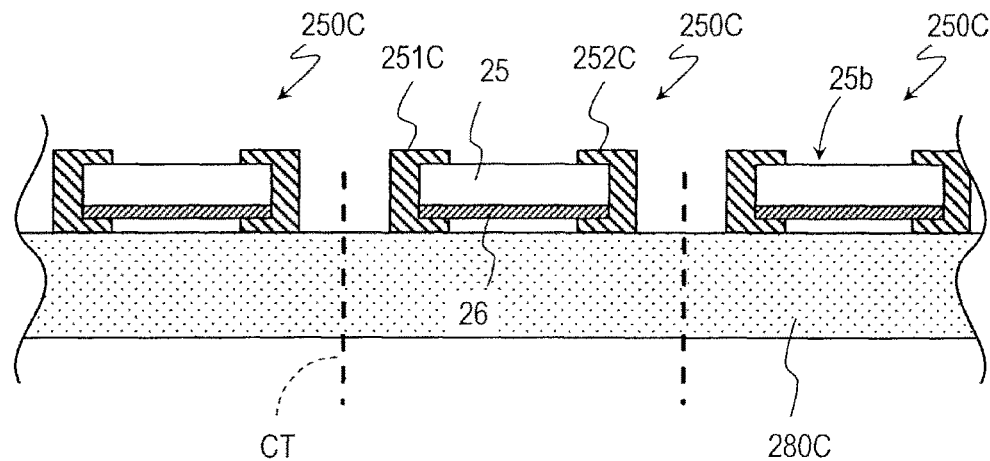
FIG. 19 is a schematic sectional view explaining a third variation of the method of manufacturing a light emitting device.

For example, instead of the jumper member 250A described above, the jumper chip 250C shown in FIG. 18 can be used. In general, a commercially available jumper chip has a smaller thickness as compared to a light emitting structure such as a LED package. Accordingly, as shown in FIG. 19, jumper chips 250C can be bonded to a sheet 280C having a predetermined thickness for thickness adjustment purposes, such as a resin sheet, and the sheet 280C can be cut per jumper chip 250C. In this example, the jumper chips 250C are fixed to the sheet 280C facing the lower face 25b of the base 25 away from the sheet 280C by using an adhesive (not shown in FIG. 19).

After fixing the jumper chips 250C to the sheet 280C, the sheet 280C is cut into pieces of a predetermined size such that each sheet piece includes a jumper chip 250C. For example, the sheet 280C is cut along the thick dotted lines indicated in FIG. 19. Prefixing a jumper chip 250C to a resin sheet piece can facilitate placing the jumper chip 250C on the support 400.

Figure 20:
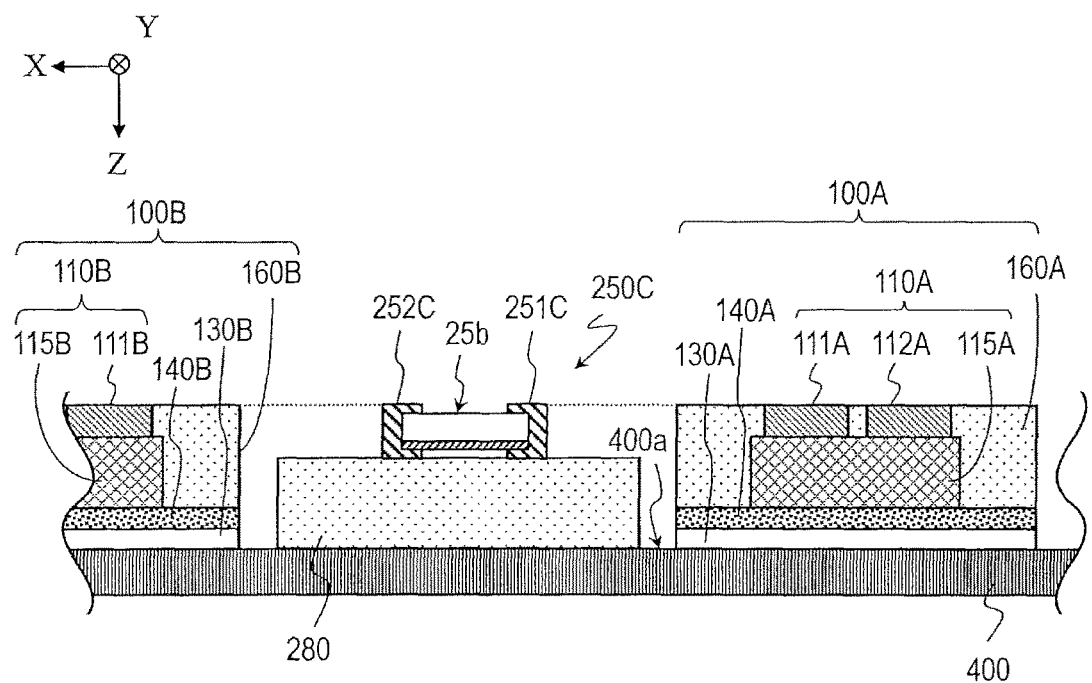
FIG. 20 is a schematic sectional view explaining the third variation of the method of manufacturing a light emitting device.

After cutting the sheet 280C, as shown in FIG. 20, a jumper chip 250C fixed to a resin sheet piece, together with a first light emitting structure 100A and a second light emitting structure 100B, is arranged on the support 400. In this example, the resin sheet piece supporting the jumper chip 250C performs the function of the support member 280 described above. The subsequent processes can be the same or similar to in the example explained with reference to FIG. 5 to FIG. 9, for example. By interposing a resin sheet piece between the jumper chip 250C and the support 400, the positions of the surfaces of the first terminal 251C and the second terminal 252C can be substantially aligned with the positions of the surfaces of the electrodes of the light emitting elements (the first electrodes 111A and 111B, and the second electrodes 112A and 112B) as indicated by the dotted lines in FIG. 20.

According to such processes, the resin layer 210T can be reduced its thickness after covering the first light emitting element 110A, the second light emitting element 110B, and the jumper chip 250C, and thus the surfaces of the first and second terminals 251C and 252C, and the surfaces of the electrodes of the light emitting elements can be easily exposed from the resin layer 120T. In other words, the electrical connection between the first wiring 210 and the jumper chip 250C can be more securely achieved.

The use of a commercially available jumper chip can provide the benefit of forming an intersection between the first wiring 210 and the second wiring 220 with an inexpensive component. A Zener diode or varistor whose surface is insulated, or a functional part for electromagnetic interference (EMI) countermeasure such as an LC filter can alternatively be used as a jumper chip 250C. Applying such a functional part as a jumper element in the light emitting device 200 can prevent the electrostatic destruction of a light emitting element.

In this example, depending on the laser beam irradiation conditions, the base 25 of the jumper chip 250C may be subjected to laser beam irradiation when portions of the resin layer 120T are removed by laser beam irradiation. However, the base 25 of the jumper chip 250C is formed with a ceramic material or the like, and thus breakage of the electrical connection between the first terminal 251C and the second terminal 252C hardly occur even if the base is exposed to such resin removal irradiation conditions.

Figure 21:
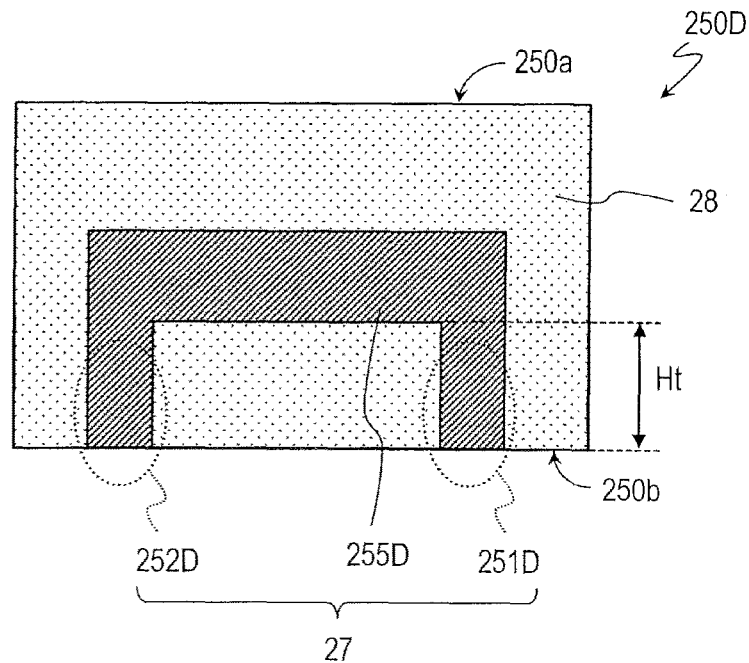
FIG. 21 is another example of a jumper member applicable as a jumper element disposed between light emitting structures.

Of course, instead of an inexpensive general purpose component, a jumper member suited for the wiring design or the like can be obtained beforehand for use as the jumper member 250 disposed between light emitting structures. FIG. 21 is another example of a jumper member usable as the jumper member 250.

The jumper member 250D shown in FIG. 21 includes a conducting part 27 formed of a metal or the like and an insulating part 28 covering the conducting part 27. The insulating part 28 is formed with a light reflecting resin composition the same as or similar to the material used for the reflecting resin member 160A and the reflecting resin member 160B, for example. The conducting part 27 is bent within the insulating part 28, and has two sections elongated in the direction from the upper face 250a to the lower face 250b of the jumper member 250D. A portion of each of the two sections is exposed at the lower face 250b of the jumper member 250D. In this example, the portions of the conducting part 27 extending in the direction from the upper face 250a to the lower face 250b of the jumper member 250D are respectively referred to as a first terminal 251D and a second terminal 252D. The conducting part 27 of the jumper member 250D has a main body 255D linking the first terminal 251D and the second terminal 252D.

Figure 22:
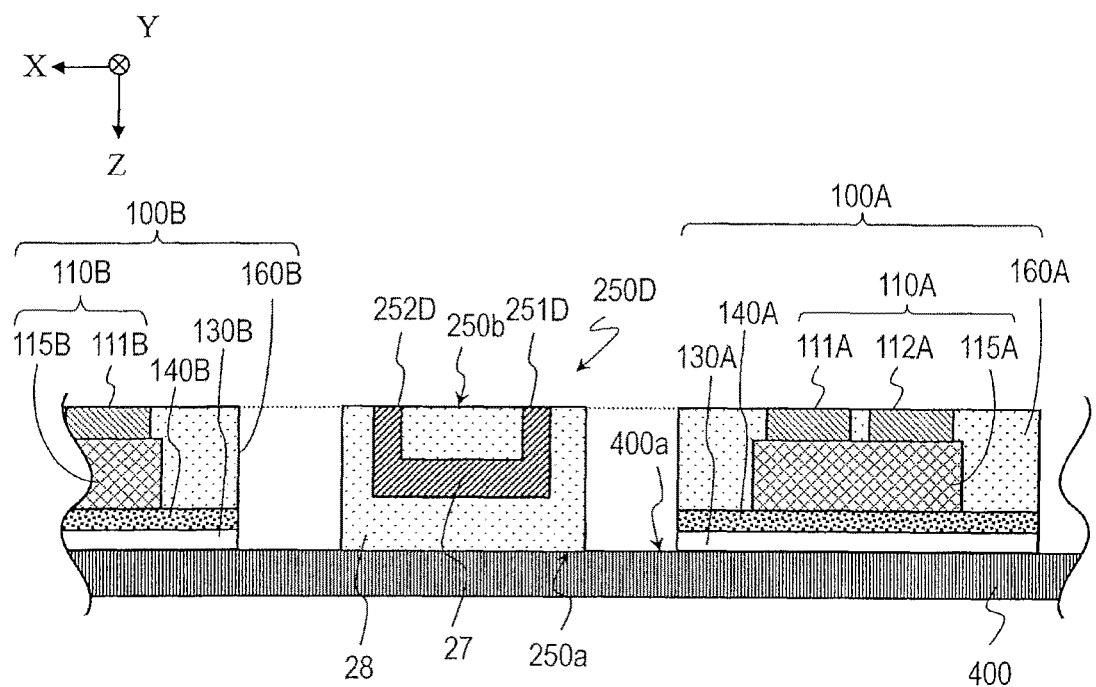
FIG. 22 is a schematic sectional view explaining a fourth variation of the method of manufacturing a light emitting device.

FIG. 22 schematically shows an exemplary method of manufacturing a light emitting device utilizing a jumper member 250D. Similar to each example explained in the foregoing, a first light emitting element 110A, a second light emitting element 110B, and a jumper member 250D are obtained and then arranged on a support 400. At this time, the jumper member 250D is temporarily fixed to the support 400 such that the upper face 250a of the jumper member 250D faces the upper face 400a of the support 400. According to this embodiment, the distance from the upper face 250a of the jumper member 250D to the main body 255D of the conducting part 27 is adjustable, and the position of the lower face 250b of the jumper member 250D can substantially be aligned with the positions of the lower faces of the light emitting structures (the first light emitting structure 100A and the second light emitting structure 100B in this example) in the Z direction at the time of disposing the first light emitting element 110A, the second light emitting element 110B, and the jumper member 250D on the support 400. In other words, the positions of the surfaces of the first terminal 251D and the second terminal 252D can substantially be aligned with the positions of the surfaces of the electrodes of the light emitting elements (the first electrodes 111A and 111B, and the second electrodes 112A and 112B) in the Z direction without requiring a support member 280.

Figure 23:
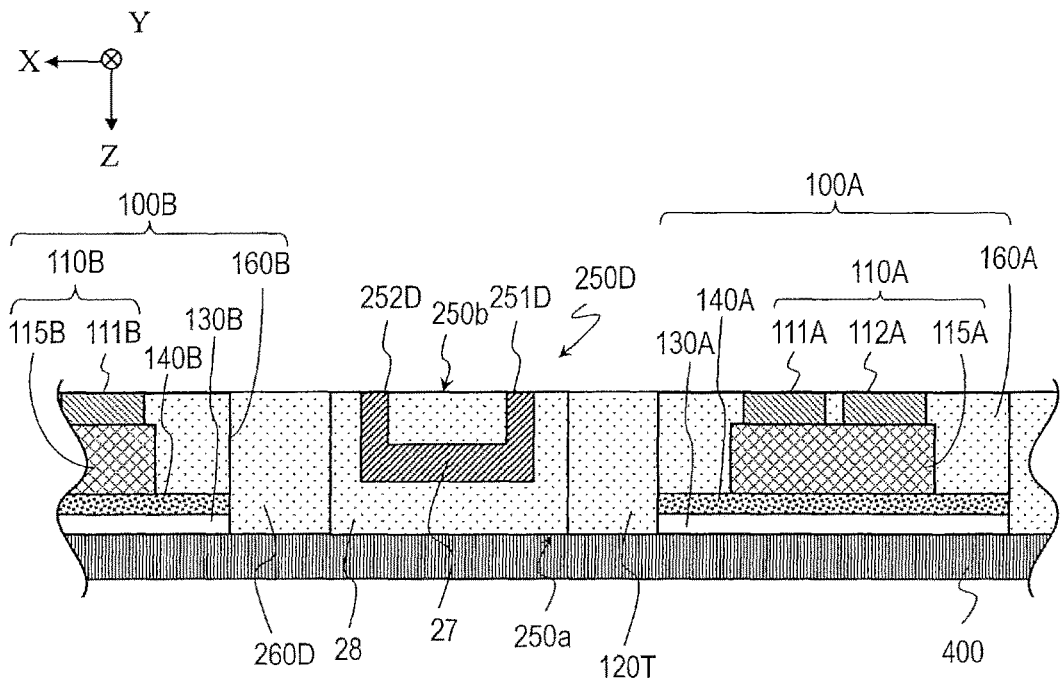
FIG. 23 is a schematic sectional view explaining the fourth variation of the method of manufacturing a light emitting device.

After arranging the first light emitting element 110A, the second light emitting element 110B, and the jumper member 250D on the support 400, similar to the example explained with reference to FIG. 5 and FIG. 6, a resin layer 120T covering these is formed, followed by reducing the thickness of the resin layer 120T by grinding or the like until, for example, the surfaces of the electrodes of the light emitting elements are exposed. At this time, because the positions of the surfaces of the first terminal 251D and the second terminal 252D are substantially aligned with the positions of the surfaces of the electrodes of the light emitting elements in the Z direction, as shown in FIG. 23, the surfaces of the first terminal 251D and the second terminal 252D would also be exposed from the ground surface. The resin layer 120T after being grinded includes a reflecting resin member 260C that covers the jumper member 250D, as a part thereof.

Figure 24:
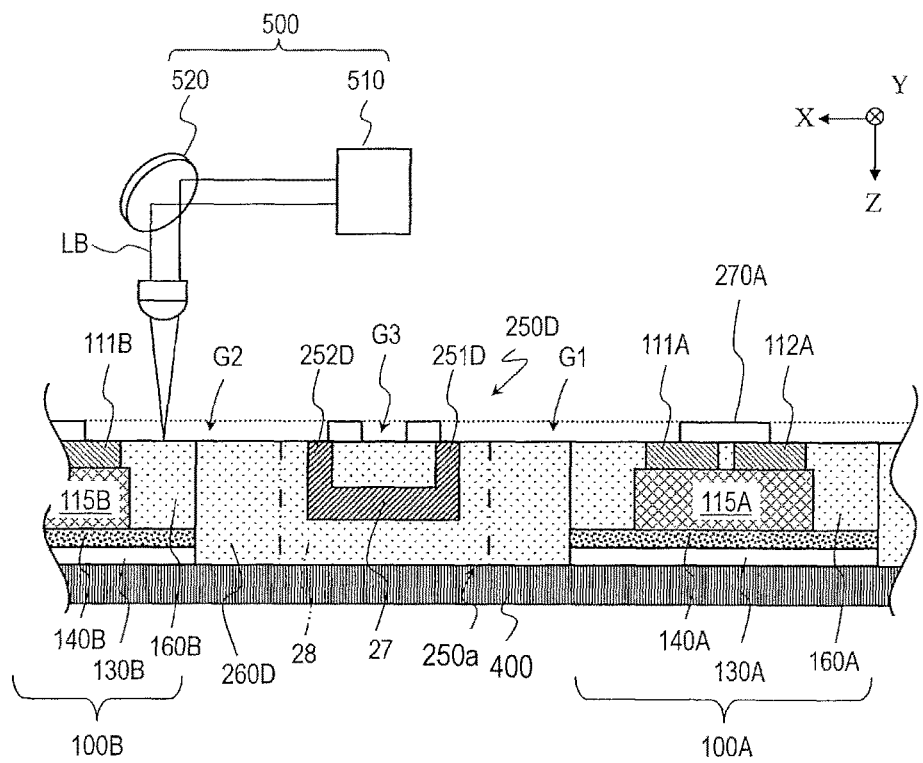
FIG. 24 is a schematic sectional view explaining the fourth variation of the method of manufacturing a light emitting device.

The subsequent processes can be the same or similar to those explained with reference to FIG. 7 to FIG. 9. A first groove G1, a second groove G2, and a third groove G3 are formed by, for example, disposing a resin layer 270S on the ground surface of the resin layer 120T and partially removing the resin layer 270S by laser beam irradiation or the like. In this example, as shown in FIG. 24, a portion of the surface of the first electrode 111A of the first light emitting element 110A and a portion of the surface of the first terminal 251D of the jumper member 250D are exposed in the first groove G1, and a portion of the surface of the first electrode 111B of the second light emitting element 110B and a portion of the surface of the second terminal 252D of the jumper member 250D are exposed in the second groove G2.

Subsequently, first wiring 210 and second wiring 220 can be formed by supplying a conducting material in the first groove G1, the second groove G2, and the third groove G3 with a conducting material. This can electrically connect the first electrode 111A of the first light emitting element 110A and the first electrode 111B of the second light emitting element 110B via the first wiring 210 and the conducting part 27 of the jumper member 250D.

In this example, it is beneficial for the distance from the lower face 250b of the jumper member 250D to the main body 255D of the conducting part 27 (the distance indicated by the double-headed arrow Ht) to be at least 50 µm. As is understood from FIG. 24, the portion of the third groove G3 extending between the first groove G1 and the second groove G2 is formed in the position that overlaps the main body 255D of the jumper member 250D in a bottom view. Accordingly, in the process of partially removing the resin layer 270S, a portion of the insulating part 28 of the jumper member 250D can be removed. Even in such a case, when the distance from the lower face 250b of the jumper member 250D to the main body 255D of the conducting part 27 is at least 50 µm, the bottom of the third groove G3 is less likely to reach the main body 255D of the jumper member 250D. In other words, short circuits between the first wiring 210 and the second wiring 220 can readily be circumvented.

As described above, according to the embodiments of the present disclosure, a jumper element having a desired shape can be utilized, and a high degree of design flexibility for wiring can be provided, for example, a high degree of flexibility in accommodation changes in the number or the layout of light emitting structures. Accordingly, it is basically unnecessary to prepare a wiring board which has wiring per arrangement and suited for each arrangement of light emitting elements. This can reduce the manufacturing costs of a light emitting device. In the case of a conventional structure in which a plurality of light emitting elements each having a positive electrode and a negative electrode are arranged on a wiring board, a large space is required on the wiring board because the wiring disposed on the wiring board increases as the number of light emitting elements mounted increases. In contrast, according to certain embodiments of the present disclosure, a wiring pattern which includes intersections between positive side wiring and negative side wiring can be relatively easily formed on the light emitting device side, but not on the wiring board side. This, for example, can also make it relatively easy to concentrate the terminals to be connected to an external power supply at one location of the light emitting device or the wiring board. The embodiments described above are merely examples, and various combinations of embodiments and/or examples are possible to the extent that such combinations do not cause any technical inconsistency.

According to certain embodiments of the present disclosure, a substrate having a complex wiring pattern formed thereon is unnecessary, and an easily mountable light emitting device can be provided. The embodiments of the present disclosure are widely applicable as various light sources for lighting fixtures, light sources for vehicle applications, light sources for backlights, and the like.

What is claimed is:

1. A light emitting device comprising:
  a first light emitting element that includes a first electrode having a first polarity and a second electrode having a second polarity that is different from the first polarity;

a circuit element that includes a main body, and a first terminal and a second terminal electrically connected with one another via the main body;

a first wiring having the first polarity connecting the first electrode of the first light emitting element and the first terminal of the circuit element; and a second wiring having the second polarity located in a layer common with a layer of the first wiring and including a portion elongated between the first terminal and the second terminal of the circuit element in a bottom view, wherein a lower surface of the main body of the circuit element is positioned at a distance above an interface between an upper surface of the first wiring and the first electrode of the first light emitting element.

2. The light emitting device according to claim 1, further comprising a cover part collectively covering the first light emitting element and the circuit element, wherein the first wiring includes a first part positioned in a first groove of the cover part and a second part in a second groove of the cover part, the first part being formed closer to the first terminal than the second part is to the first terminal, the second part being formed closer to the second terminal than the first part is to the second terminal, and a portion of the second wiring in a third groove formed in the cover part is positioned between the first groove and the second groove.

3. The light emitting device according to claim 1, wherein a portion of the first wiring located between the first electrode of the first light emitting element and the first terminal of the circuit element is elongated in a first direction in the bottom view, and a portion of the second wiring located between the first terminal and the second terminal of the circuit element is elongated in a second direction intersecting the first direction in the bottom view.

4. The light emitting device according to claim 2, wherein a portion of the first wiring located between the first electrode of the first light emitting element and the first terminal of the circuit element is elongated in a first direction in the bottom view, and a portion of the second wiring located between the first terminal and the second terminal of the circuit element is elongated in a second direction intersecting the first direction in the bottom view.

5. The light emitting device according to claim 1, wherein
the first wiring has a thickness in a range of from 5 µm to 50 µm, and
the second wiring has a thickness in a range of from 5 µm to 50 µm.

6. The light emitting device according to claim 2, wherein
the first wiring has a thickness in a range of from 5 µm to 50 µm, and
the second wiring has a thickness in a range of from 5 µm to 50 µm.

7. The light emitting device according to claim 3, wherein
the first wiring has a thickness in a range of from 5 µm to 50 µm, and
the second wiring has a thickness in a range of from 5 µm to 50 µm.

8. The light emitting device according to claim 2, wherein
the first groove has a depth in a range of from 5 µm to 50 µm,
the second groove has a depth in a range of from 5 µm to 50 µm, and
the third groove has a depth in a range of from 5 µm to 50 µm.

9. The light emitting device according to claim 4, wherein
the first groove has a depth in a range of from 5 µm to 50 µm,
the second groove has a depth in a range of from 5 µm to 50 µm, and
the third groove has a depth in a range of from 5 µm to 50 µm.

10. The light emitting device according to claim 6, wherein
the first groove has a depth in a range of from 5 µm to 50 µm,
the second groove has a depth in a range of from 5 µm to 50 µm, and
the third groove has a depth in a range of from 5 µm to 50 µm.

11. The light emitting device according to claim 2, further comprising a second light emitting element that includes a first electrode having a first polarity and a second electrode having a second polarity that is different from the first polarity, wherein the circuit element is positioned between the first light emitting element and the second light emitting element in the bottom view, and the first electrode of the second light emitting element is connected to the second part of the first wiring.

12. The light emitting device according to claim 4, further comprising a second light emitting element that includes a first electrode having a first polarity and a second electrode having a second polarity that is different from the first polarity, wherein the circuit element is positioned between the first light emitting element and the second light emitting element in the bottom view, and the first electrode of the second light emitting element is connected to the second part of the first wiring.

13. The light emitting device according to claim 6, further comprising a second light emitting element that includes a first electrode having a first polarity and a second electrode having a second polarity that is different from the first polarity, wherein the circuit element is positioned between the first light emitting element and the second light emitting element in the bottom view, and the first electrode of the second light emitting element is connected to the second part of the first wiring.

14. The light emitting device according to claim 8, further comprising a second light emitting element that includes a first electrode having a first polarity and a second electrode having a second polarity that is different from the first polarity, wherein the circuit element is positioned between the first light emitting element and the second light emitting element in the bottom view, and the first electrode of the second light emitting element is connected to the second part of the first wiring.

15. The light emitting device according to claim 1, further comprising a second light emitting element that includes a first electrode having a first polarity and a second electrode having a second polarity that is different from the first polarity, wherein the circuit element is positioned between the first light emitting element and the second light emitting element in the bottom view, and the second electrode of the second light emitting element is connected to the second wiring.

16. The light emitting device according to claim 2, further comprising a second light emitting element that includes a first electrode having a first polarity and a second electrode having a second polarity that is different from the first polarity, wherein
   the circuit element is positioned between the first light emitting element and the second light emitting element in the bottom view, and
   the second electrode of the second light emitting element is connected to the second wiring.

17. The light emitting device according to claim 3, further comprising a second light emitting element that includes a first electrode having a first polarity and a second electrode having a second polarity that is different from the first polarity, wherein
   the circuit element is positioned between the first light emitting element and the second light emitting element in the bottom view, and
   the second electrode of the second light emitting element is connected to the second wiring.

18. The light emitting device according to claim 4, further comprising a second light emitting element that includes a first electrode having a first polarity and a second electrode having a second polarity that is different from the first polarity, wherein
   the circuit element is positioned between the first light emitting element and the second light emitting element in the bottom view, and
   the second electrode of the second light emitting element is connected to the second wiring.

19. The light emitting device according to claim 5, further comprising a second light emitting element that includes a first electrode having a first polarity and a second electrode having a second polarity that is different from the first polarity, wherein
   the circuit element is positioned between the first light emitting element and the second light emitting element in the bottom view, and
   the second electrode of the second light emitting element is connected to the second wiring.

20. The light emitting device according to claim 8, further comprising a second light emitting element that includes a first electrode having a first polarity and a second electrode having a second polarity that is different from the first polarity, wherein
   the circuit element is positioned between the first light emitting element and the second light emitting element in the bottom view, and
   the second electrode of the second light emitting element is connected to the second wiring.

\* \* \* \* \*